(12) United States Patent
Satou et al.

(10) Patent No.: US 6,937,059 B2
(45) Date of Patent: *Aug. 30, 2005

(54) OUTPUT BUFFER CIRCUIT WITH CONTROL CIRCUIT FOR MODIFYING SUPPLY VOLTAGE AND TRANSISTOR SIZE

(75) Inventors: Takashi Satou, Koganei (JP);
Shigezumi Matsui, Nishitokyo (JP);
Peter Lee, Musashino (JP); Gouichi Yokomizo, Hinode (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/667,446

(22) Filed: Sep. 23, 2003

(65) Prior Publication Data

US 2004/0070420 A1 Apr. 15, 2004

Related U.S. Application Data

(62) Division of application No. 10/416,709, filed as application No. PCT/JP00/08443 on Nov. 30, 2000.

(51) Int. Cl.[7] .............................................. H03K 19/003
(52) U.S. Cl. ........................................ 326/30; 326/333
(58) Field of Search ....................... 326/30–31, 33–34, 326/26–27; 327/333

(56) References Cited

U.S. PATENT DOCUMENTS 5,894,238 A * 4/1999 Chien ......................... 327/112

6,512,401 B2 * 1/2003 Clark et al. ................. 327/112

FOREIGN PATENT DOCUMENTS

| JP | 6-260922 | 5/1991 |
| JP | 2000-049583 | 7/1998 |

* cited by examiner

*Primary Examiner*—James H. Cho
(74) *Attorney, Agent, or Firm*—Reed Smith LLP; Stanley P. Fisher, Esq.; Juan Carlos A. Marquez, Esq.

(57) ABSTRACT

In this invention, a control circuit (111) controls both the power supply voltage (VDDQ) and the transistor size of the external output buffer to thereby select the lowest supply voltage that achieves the impedance matching with the transmission line (100), to thereby save bus termination by a resistor, thus consequently achieving both the lowering of the power consumption and the speeding-up in the data transmission. The power consumption during the data transmission is proportional to the square of the supply voltage. If the operational supply voltage of the external output buffer is lowered, the power consumption will be reduced accordingly. If the operational supply voltage of the external output buffer is lowered, the impedance thereof will be increased apparently; and at the same time, if the transistor size of the external output buffer is increased, the increased impedance will be decreased. By bringing the output impedance (ON-resistance) of the external output buffer into conformity with the impedance of the transmission line, it becomes possible to output the signal without distortions on the waveform.

15 Claims, 28 Drawing Sheets

FIG. 4

(A) (MASTER INTEGRATED CIRCUIT)

| ENi code | NMOS size (um) | I/O Power supply voltage VDDQ (V) | | | |
|---|---|---|---|---|---|
| | | 1.5 | 1.8 | 2.2 | 2.5 |
| (001) | 44 | 566 | 345 | 231 | 189 |
| (010) | 88 | 283 | 173 | 116 | 95 |
| (011) | 132 | 189 | 115 | 77 | 63 |
| (100) | 176 | 142 | 86 | 58 | 47 |
| (101) | 220 | 113 | (69) | 46 | 38 |
| (110) | 264 | 94 | 58 | (39) | 32 |
| (111) | 308 | 81 | 49 | 33 | 27 |

A1   B1

(B) (SLAVE INTEGRATED CIRCUIT)

| ENi code | NMOS size (um) | I/O Power supply voltage VDDQ (V) | | | |
|---|---|---|---|---|---|
| | | 1.5 | 1.8 | 2.2 | 2.5 |
| (001) | 40 | 228 | 182 | 151 | 136 |
| (010) | 80 | 114 | 91 | 76 | 68 |
| (011) | 120 | 76 | (61) | 50 | 45 |
| (100) | 160 | 57 | 46 | (38) | 34 |
| (101) | 200 | 46 | 36 | 30 | 27 |
| (110) | 240 | 38 | 30 | 25 | 23 |
| (111) | 280 | 33 | 26 | 22 | 19 |

| To | From | What | CODE to | from | what |
|---|---|---|---|---|---|
| All | Master | START ALL SETTING MODES | 000 | 100 | 0000 |
| All | Master | COMPLETE ALL SETTING MODES | 000 | 100 | 0001 |
| VGEN | Master | REQUEST VOLTAGE SETTING (UP) | 111 | 100 | 0010 |
| VGEN | Master | REQUEST VOLTAGE SETTING (DOWN) | 111 | 100 | 0011 |
| Master | VGEN | COMPLETE VOLTAGE SETTING | 100 | 111 | 0100 |
| Slave | Master | REQUEST TO START W SETTING | id | 100 | 0101 |
| Slave | Master | REQUEST TO SET W STANDARD VALUE | id | 100 | 0110 |
| Master | Slave | COMPLETE W SETTING (SUCCEEDED) | 100 | id | 0111 |
| Master | Slave | COMPLETE W SETTING (FAILED) | 100 | id | 1000 |

FIG. 16

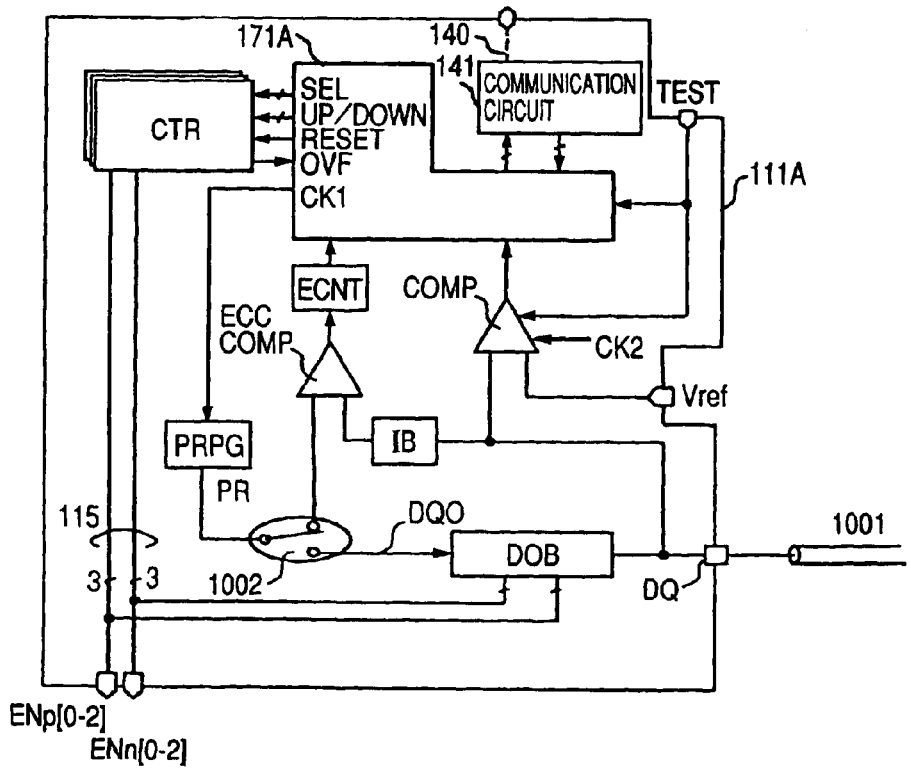

OUTPUT BUFFER CIRCUIT WITH CONTROL CIRCUIT FOR MODIFYING SUPPLY VOLTAGE AND TRANSISTOR SIZE

This application is a Divisional application of nonprovisional U.S. Application No. 10/416,709 filed on May 14, 2003, which is a national stage application of PCT/JP00/08443 filed on Nov. 30, 2000. Priority is claimed based upon U.S. Application No. 10/416,709 filed on May 14, 2003, which claims the priority date of PCT/JP00/08443 filed on Nov. 30, 2000.

TECHNICAL FIELD

The present invention relates to an impedance matching technique or interfacing technique that satisfies the needs for lowering power consumption of semiconductor integrated circuits and speeding up data transmissions between the semiconductor integrated circuits. For example, the invention relates to a technique effective for use in the semiconductor integrated circuits such as microcomputers and memories, data processing systems that require an extremely lowered power consumption performance, such as mobile telephones and mobile information terminals, and data processing systems that require a fast data transmission, such as network control devices, etc.

BACKGROUND ART

The interface between a MPU (Micro-Processing Unit) and a DRAM (Dynamic Random Access Memory) and so forth are standardized in an intention of the applications to the PC (Personal Computer), etc. For example, the STBL (Stub Series Terminated Logic) interface is being used as a typical fast interface between the MPU and the DRAM.

The data transmission system used in the above interface requires the termination by a resistor or the like, in order to suppress signal reflections. Accordingly, in the applications using a MCM (Multi-Chip Module) with plural bare chips mounted on a compound circuit board and a small circuit board, it is not easy to apply the interface, especially in view of lowering power consumption and saving a space for the component.

As a technique to achieve the impedance matching with the transmission line in the interface, for speeding up the data transmission, a method is already proposed, which configures one output circuit by a parallel connection of plural small output circuits of different sizes, selects the optimum number of the output circuits in the environmental conditions (temperature, dispersions of manufacturing process, etc.), and makes the impedance matching with the wiring connected outside the chip. Such a technique is disclosed, for example, in JP-A No. Hei 6(1994)-260992 and JP-A No. 2000-49583. These techniques, assuming that the impedance matching of the output buffer with the transmission line suppresses signal reflections, configure the output buffer with plural push-pull circuits connected in parallel, and make the impedance matching with the transmission line, paying attention to that the ON-resistance of the output buffer differs according to the number of the push-pull circuits being put in operation.

Although the above techniques are able to realize the high-speed data transmission by the impedance matching, the power supply voltage is constant; therefore, the power consumption will not be reduced. Especially in these days, mobile equipment is widely used, and the reduction of the power consumption has been the important element in the system design. It is well known that lowering the supply voltage in the interface is effective in reducing the power consumption; however, a technological concept is not yet known, which correlates lowering the supply voltage with making the impedance matching.

From a research made by the inventors, the memory consumption in the mobile information device such as a mobile telephone and the network device such as a router will presumably exceed the memory consumption in the personal computer (PC). Accordingly, the current universal interface between a MPU and a memory, which is standardized for the PC as the main target, will conceivably be changed into what is specialized in individual applications. Accordingly, as the interfacing technique for the data transmission, used in a small-scale system such as the mobile information device, the inventor envisioned the following applications to: (a) a multi-chip module (MCM) using a comparably small-capacity memory such as one in which a number of usage of CPU and memory (or a peripheral logic LSI) is 1:1 or 1:2, and a small-sized board, (b) a system requiring a high-speed (wide bandwidth) data transmission of higher than 100 MHz, for example, such as a network control device, and (c) a system requiring a ultra-low power consumption property, such as a mobile information terminal represented by a mobile telephone.

An object of the present invention is to provide a semiconductor integrated circuit that easily realizes lowering the power consumption of the interface connecting plural semiconductor integrated circuits having different transistor characteristics as well as the impedance matching of the output circuit.

Another object of the present invention is to provide an optimum interfacing technique for lowering the power consumption of the interface connecting plural semiconductor integrated circuits having different transistor characteristics as well as the impedance matching of the output circuit, in the system such as: (a) a data processing system implemented with the multi-chip module (MCM) and a small-sized board, (b) a data processing system requiring a high-speed (wide bandwidth) data transmission of higher than 100 MHz, for example, such as a network control device, and (c) a data processing system requiring a ultra-low power consumption property, such as a mobile information terminal represented by a mobile telephone.

The above and other objects and novel features of the present invention will be made clear from the following descriptions and appended drawings of this specification.

DISCLOSURE OF THE INVENTION

[1] The invention intends to control both the power supply voltage and the transistor size of the external output buffer to thereby select the lowest supply voltage that achieves the impedance matching with the transmission line, and to thereby save the termination by a resistor, thus consequently achieving both the lowering of the power consumption and the speeding-up in the data transmission.

The power consumption during the data transmission is given by (load capacitance)×(data inversion rate)×(operational frequency)×(supply voltage)×(supply voltage). In this manner, the power consumption is proportional to the square of the supply voltage. And, if the operational supply voltage of the external output buffer is lowered, the power consumption will be reduced accordingly. If the operational supply voltage of the external output buffer is lowered, the impedance thereof will be increased apparently; and at the same time, if the transistor size of the external output buffer is increased, the increased impedance will be decreased. The reverse will be possible. To lower the operational supply voltage of the external output buffer for lowering the power consumption, and to increase the transistor size of the external output buffer for canceling the impedance increase by lowering the operational supply voltage will make it possible to make a necessary impedance matching with the transmission line. To bring the output impedance (ON-resistance) of the external output buffer into conformity with the impedance of the transmission line will make a signal output without distortions on the waveform; even if there occurs a reflection at a position except for the far end of the transmission line, the reflected wave will be absorbed by the driver, the time required for the distortions on the waveform being eliminated will be shorter (when the impedances are not matched, the reflected wave is reflected again by the external output buffer, so that the disturbances on the waveform will not be removed quickly), and the speeding-up of the data transmission will be realized. Thereby, both the lowering of the power consumption of the external output buffer and the speeding-up of the data transmission can be realized at the same time.

Further in detail, the semiconductor integrated circuit is configured with, in a semiconductor chip, an internal circuit, an external output buffer connected to the internal circuit, and a control circuit capable of requesting to modify an operational supply voltage given to the external output buffer, and capable of selectively controlling an output transistor size of the external output buffer according to the operational supply voltage. Here, the control circuit selectively controls the output transistor size according to an external power supply voltage, in a direction of making an impedance matching of the external output buffer and a transmission line connected outside the chip to the external output buffer.

Such semiconductor integrated circuits are realized as MPUs, DRAMs, and the other peripheral LSIs, etc. Generally, the semiconductor integrated circuits are produced each by means of different manufacturing processes, and are optimized by the applications each. Accordingly, transistors in the semiconductor integrated circuits have different characteristics by the semiconductor integrated circuits each or by the manufacturing processes each. For lowering the power consumption of the interface connecting the semiconductor integrated circuits, simply lowering the operational supply voltage to the individual semiconductor integrated circuit is impossible of making the impedance matching of the external output buffer of the individual semiconductor integrated circuit with the impedance of the transmission line, because the transistor characteristics are different each by the semiconductor integrated circuits. A high-speed data transmission will require the impedance matching of the output buffer with the impedance of the transmission line. The individual semiconductor integrated circuits each are controlled so as to associate the operational supply voltage of the external output buffer with the output transistor size. Thereby, the individual semiconductor integrated circuits each are able to individually set the transistor size of the output buffer, even though a comparably low operational supply voltage is commonly supplied to the external output buffers of different semiconductor integrated circuits. Therefore, the high-speed operation becomes possible in the impedance matching with the transmission line, while accelerating low power consumption as a whole.

On the contrary, in order to realize the impedance matching only by the supply voltage, there occurs a necessity to provide different operational supply voltages each to the semiconductor integrated circuits to be used. In this case, not only the data transmission between different voltages is difficult, but also the wiring layout on the packaging substrate becomes extremely complicated. Also, the integrated circuit for the power supply has to output many independently controllable voltages, which conceivably increases the cost. Thus, it is not realistic to implement the impedance matching only by the control of the supply voltage.

Especially, the above means ensures that the external output buffer is allowed to use an operational supply voltage different from that supplied to the internal circuit. This will effect the lowering of the power consumption in the interface part, apart from the lowering of the power consumption in the processor core.

For the countermeasure against electrostatic breakdown by ESD (Electro-Static Discharge), it is impossible to decrease the area of the external output buffer in the semiconductor integrated circuit, even with a further progress in the micro-fabrication technique. The output buffer to necessarily occupy a large area can effectively be used for the impedance matching.

[2] According to a further concrete mode of the invention, the control circuit determines by using a dummy circuit an impedance matching state of the external output buffer and the transmission line connected outside the chip to the external output buffer, and selectively controls the output transistor size according to an external power supply voltage. Thus, using the dummy circuit saves connecting the ON-resistance control circuit of the output transistor to part of unit circuits of the external output buffer, which maintains a state of the characteristics of the unit circuits of the output buffer being even.

The control circuit adopting the dummy circuit includes the dummy circuit, a comparator, and a selective control circuit. The dummy circuit includes a dummy external output buffer having the same circuit configuration as a unit circuit of the external output buffer, and a dummy output terminal capable of connecting an output terminal of the dummy external output buffer to the outside of the semiconductor chip. The comparator compares a specific varying transient voltage appearing on the dummy output terminal with a reference voltage, when the dummy external output buffer performs an output operation toward a dummy transmission line connected to the dummy output terminal. The selective control circuit determines the magnitude of an impedance of the dummy transmission line and an impedance of the dummy external output buffer on the basis of a comparison result of the comparator; and if the latter is smaller, it controls an output transistor of the dummy external output buffer as well as an output transistor of the external output buffer to select larger transistor sizes, and if the latter is larger, it controls the output transistor of the dummy external output buffer as well as the output transistor of the external output buffer to select smaller transistor sizes, thus selectively controls the output transistor size.

[3] It is desirable in view of the unification of control that one semiconductor integrated circuit instructs the operational supply voltage to plural integrated circuits connected through the transmission line. The control circuit of such a semiconductor integrated circuit (master) outputs the first information (sig2) to designate a level of the operational supply voltage, and selectively controls the output transistor size according to the operational supply voltage answered in response to the first information. When it is impossible to select the output transistor size for making the impedance matching, the control circuit is needed to request the modification of the operational supply voltage by means of the first information, and to redo the selection of the output transistor size.

Further, the control circuit of the semiconductor integrated circuit as the master is needed to output the second information (sig4) to the outside, to wait for the third information (sig5) answered from the outside to the second information, to request the modification of the operational supply voltage by means of the first information and redo the selection of the output transistor size, to wait for the fourth information (sig6) answered from the outside to the second information, and to complete the selective control of the output transistor size.

The control circuit of the semiconductor integrated circuit (slave) interfacing with the master is needed to input the second information (sig4) from the outside, to start the selective control of the output transistor size according to the operational supply voltage by responding to the second information, to output the third information (sig5) to the outside when it is impossible to select an output transistor size for making the impedance matching, and to output the fourth information (sig6) to the outside when it is possible to select the output transistor size for making the impedance matching.

[4] There is a possibility that the semiconductor integrated circuit uses an external power supply circuit (130). In this case, the semiconductor integrated circuit has an external power supply terminal to which the operational supply voltage is supplied, and outputs the first information to the outside of the semiconductor chip.

On the other hand, when the semiconductor integrated circuit has an internal power supply circuit, the semiconductor integrated circuit is needed to include the internal power supply circuit (130A) that generates the operational supply voltage supplied to the internal circuit and the operational supply voltage supplied to the external output buffer separately on the basis of the external power supply voltage, and determines a level of the operational supply voltage supplied to the external output buffer, on the basis of the first information.

[5] According to an aspect of the data processing system, the first example of the system includes: the first semiconductor integrated circuit, the second semiconductor integrated circuit, the transmission line that connects the first external output buffer of the first semiconductor integrated circuit to the second semiconductor integrated circuit, and connects the second external output buffer of the second semiconductor integrated circuit to the first semiconductor integrated circuit, and the external power supply circuit that generates the operational supply voltage to the first and the second external output buffers. In this system, the first semiconductor integrated circuit that functions as the master instructs the external power supply circuit to be able to modify a level of the operational supply voltage, and includes the first operation mode capable of selectively controlling the output transistor size of the first external output buffer according to the operational supply voltage supplied according to the instruction. The second semiconductor integrated circuit as the slave includes the second operation mode capable of selectively controlling the output transistor size of the second external output buffer according to the operational supply voltage supplied from the external power supply circuit.

Owing to this data processing system, the first and second semiconductor integrated circuits are able to control the power supply voltage common to the external output buffers of both as well as the transistor sizes of the external output buffers individual to both. Thereby, both the integrated circuits are able to select the lowest supply voltage that achieves the impedance matching, and to save the termination by a resistor, which consequently achieves both the lowering of the power consumption and the speeding-up in the data transmission.

The data processing system according to another aspect includes: the first semiconductor integrated circuit, the second semiconductor integrated circuit, the transmission line that connects the first external output buffer of the first semiconductor integrated circuit to the second semiconductor integrated circuit, and connects the second external output buffer of the second semiconductor integrated circuit to the first semiconductor integrated circuit. In this system, the first semiconductor integrated circuit as the master includes the internal power supply circuit that generates the operational supply voltage to the first and the second external output buffers, instructs the internal power supply circuit to be able to modify a level of the operational supply voltage, and includes the first operation mode capable of selectively controlling the output transistor size of the first external output buffer according to the operational supply voltage generated according to the instruction. The second semiconductor integrated circuit as the slave includes the second operation mode capable of selectively controlling the output transistor size of the second external output buffer according to the operational supply voltage supplied from the internal power supply circuit of the first semiconductor integrated circuit.

Since the first semiconductor integrated circuit as the master incorporates the internal power supply circuit that generates the operational supply voltage to the external output buffer, it is possible to simplify the communication path and the communication procedure that exchange the signals on the packaging substrate of the data processing system, in order to determine the output transistor size and the level of the operational supply voltage.

[6] As the basic control mode of selecting the output transistor size in the above data processing system, in the first operation mode, the first semiconductor integrated circuit selectively controls the output transistor size according to the operational supply voltage, in a direction of making the impedance matching of the transmission line and the first external output buffer; and in the second operation mode, the second semiconductor integrated circuit selectively controls the output transistor size according to the operational supply voltage, in a direction of making the impedance matching of the transmission line and the first external output buffer.

As the basic control mode for the modification procedure of the operational supply voltage for the output buffer, the first semiconductor integrated circuit (master) modifies to designate the level of the operational supply voltage, and redoes the selective control of the output transistor size, in the first operation mode, when it is impossible to select the output transistor size for making the impedance matching. The second semiconductor integrated circuit (slave) instructs the first semiconductor integrated circuit to modify the level of the operational supply voltage, and redoes the selective control of the output transistor size according to a modified operational supply voltage, in the second operation mode, when it is impossible to select the output transistor size for making the impedance matching.

According to a further detailed aspect of the processing procedure for determining the output transistor sizes of the master and slave and the level of the operational supply voltage in the above data processing system, in the first mode, the first semiconductor integrated circuit (master)

outputs the first information to designate a level of the operational supply voltage, selectively controls the output transistor size according to the operational supply voltage answered in response to the first information, when it is impossible to select the output transistor size for making the impedance matching, requests to modify the operational supply voltage by means of the first information to redo selecting the output transistor size, outputs the second information to the outside, waits for the third information answered from the second semiconductor integrated circuit to the second information, requests to modify the operational supply voltage by means of the first information to redo selecting the output transistor size, waits for the fourth information answered from the second semiconductor integrated circuit to the second information, and completes the selective control of the output transistor size. In the second mode, the second semiconductor integrated circuit (slave) inputs the second information from the first semiconductor integrated circuit, starts the selective control of the output transistor size according to the operational supply voltage by responding to the second information, outputs the third information to the first semiconductor integrated circuit when it is impossible to select the output transistor size for making the impedance matching, and outputs the fourth information to the first semiconductor integrated circuit when it is possible to select the output transistor size for making the impedance matching.

[7] According to an aspect of lowering the power consumption, it is advisable that the first semiconductor integrated circuit executes, in the first operation mode, a designation of the operational supply voltage from a lower level, and execute a selection of the output transistor size from a larger size. From the viewpoint of the noise resistance, the error rate is inclined to increase, as the operational supply voltage of the external output buffer is decreased. In order to determine the operational supply voltage and the transistor size, in view of the error rate, the first and the second semiconductor integrated circuits are needed to be individually capable of detecting the error rates of data transmitted each thereto. Here, in the first operation mode, the first semiconductor integrated circuit is needed to be capable of a selection-modification control of the output transistor size while increasing the operational supply voltage, until the sum of the error rates detected individually by the first and the second semiconductor integrated circuits becomes lower than a specified value. In the second operation mode, the second semiconductor integrated circuit is needed to be capable of responding to the selection-modification control by the first semiconductor integrated circuit, and capable of the selection-modification control of the output transistor size to the operational supply voltage modified by the instruction of the first semiconductor integrated circuit.

In view of the characteristics of the semiconductor integrated circuit, such as the temperature coefficient of a resistance, etc., and the environmental changes of the data processing system, such as the ambient temperature and generation of heat, to compensate the ON-resistance of the external buffer will enhance the reliability of the impedance matching according to the operational supply voltage. In order for that, for example, the first semiconductor integrated circuit is needed to be in the first operation mode, starting with responding to a system reset until reaching an impedance matching between the transmission line and the first external output buffer, in which, in response to an arrival of a specific interval, an impedance mismatching between the transmission line and the first external output buffer is compensated by a specific amount to the matching direction. The second semiconductor integrated circuit is needed to be in the second operation mode, starting with responding to the system reset until reaching the impedance matching between the transmission line and the second external output buffer, in which, in response to the arrival of the specific interval, an impedance mismatching between the transmission line and the second external output buffer is compensated by the specific amount to the matching direction.

If the first semiconductor integrated circuit as the master detects the arrival of the specific interval, it will harmonize with the instruction control of the operational supply voltage executed by the master, which makes it possible to simplify the procedure of starting the controls by the first and second operation modes.

The number of the second semiconductor integrated circuit may be singular or plural. In case there are a plurality of them, the plural second semiconductor integrated circuits may be connected to the first semiconductor integrated circuit by individual transmission lines, and the operational supply voltage may be individualized to each of the transmission lines. Alternatively, the plural second semiconductor integrated circuits may be connected to the first semiconductor integrated circuit by a common transmission line, and the operational supply voltage ma be used commonly.

BRIEF DESCRIPTION OF THE DRAWINGS

FIG. 4 is a table showing an example in which the ON-resistances of NMOS transistors vary, when the power supply voltage VDDQ and the transistor size are controlled;

FIG. 15 is an explanatory chart of the code signals in the communication circuit;

FIG. 16 is a block diagram of a VW control circuit capable of the VW control in consideration for the transmission error rate;

BEST MODES FOR CARRYING OUT THE INVENTION

[Master Integrated Circuit and Slave Integrated Circuit]

Figure 1:
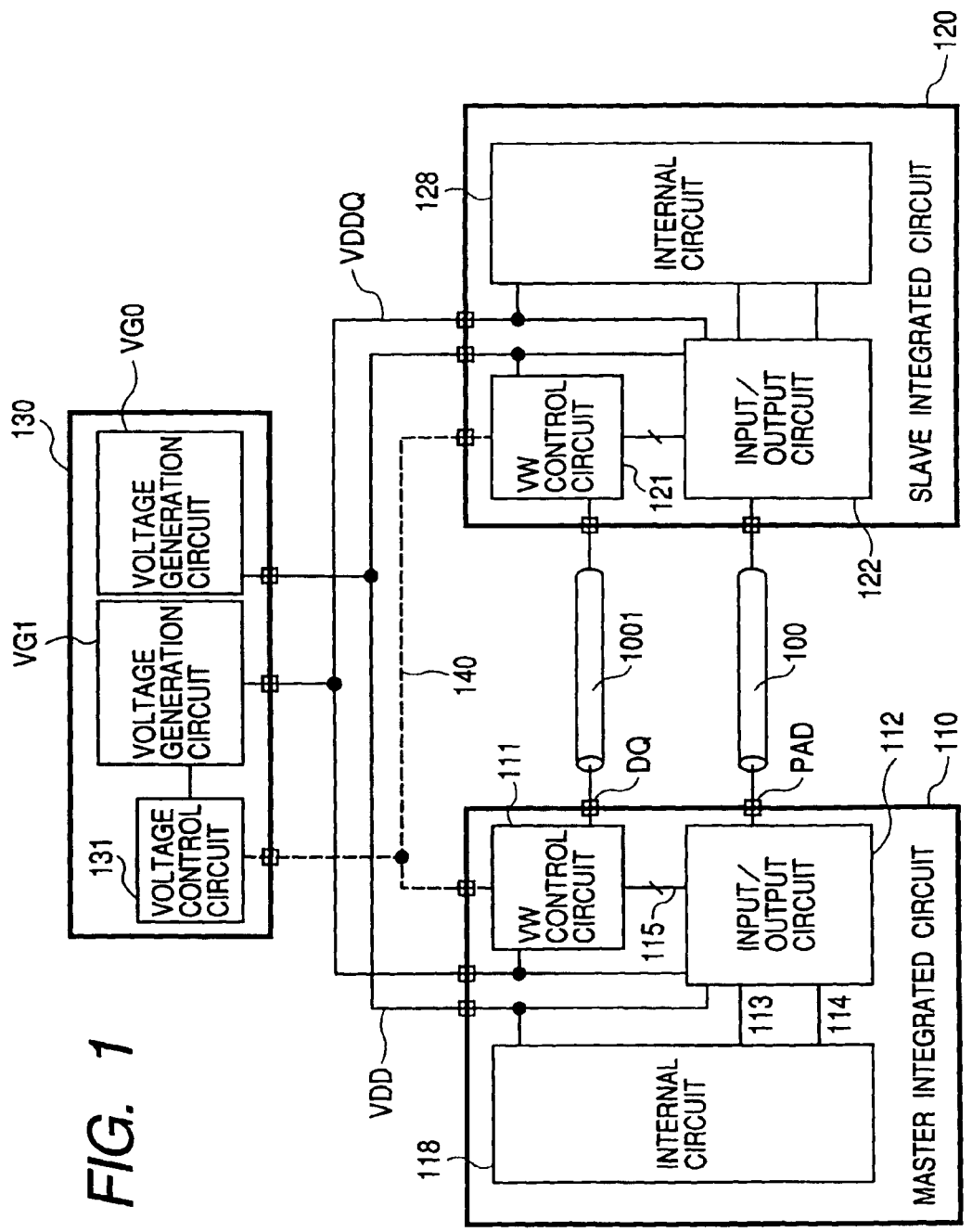
FIG. 1 is a block diagram showing one example of the data processing system that uses two units of the integrated circuits relating to the present invention.

FIG. 1 illustrates an example of a data processing system that uses two units of integrated circuits relating to the present invention. The data processing system in the drawing performs data transmissions between a semiconductor integrated circuit 110 and a semiconductor integrated circuit 120 through a data line (transmission line) 100. Here, the example has only one data transmission line 100 for the data transmission, but the invention is applicable to the case having more transmission lines such as 8 lines.

The voltage generation circuit 130 supplies the semiconductor integrated circuits 110, 120 with common supply voltages. The voltage generation circuit VG0 supplies internal circuits 118, 128 of the semiconductor integrated circuits 110, 120 with a common operational supply voltage VDD, and the voltage generation circuit VG1 supplies input/output circuits (interface circuits) of the semiconductor integrated circuits 110, 120 with a common operational voltage VDDQ. This example assumes that the internal circuits and the input/output circuits use one and the same ground voltage (VSS), which is not illustrated. Here, the internal circuit generically names a circuit except for the circuit clearly illustrated as a circuit block or circuit module in the semiconductor integrated circuit.

The voltage generation circuit 130 includes a voltage control circuit 131 for changing the voltage that the voltage generation circuit VG1 outputs. The voltage control circuit 131 changes the outputted voltage according to the instruction from the semiconductor integrated circuit 110, for example. The instruction signals, etc., are transmitted through a VW control line 140. In this example hereunder, the semiconductor integrated circuit 110 that takes the initiative in making the first setting and deciding the supply voltage and the transistor size is named as the master integrated circuit, and the semiconductor integrated circuit 120 that decides the transistor size according to the instruction from the master integrated circuit is named as the slave integrated circuit.

The semiconductor integrated circuits 110, 120 each have VW control circuits 111, 112, and input/output circuits 112, 122, respectively, in order to carry out data transmissions mutually between the semiconductor integrated circuit 110 and the semiconductor integrated circuit 120. Here, the VW control circuits 111, 112 can adopt basically the same construction in the master integrated circuit 110 and the slave integrated circuit 120. The operations of the VW control circuits 111, 112 become different in accordance with the contents of the control information exchanged through the VW control line 140. When the operation of the semiconductor integrated circuit 110 is defined by a program control as a microprocessor, the operation of the VW control circuit 111 may also be controlled by the program control. In this sense, it is recommendable to allocate the function as the master integrated circuit 110 to a programmable semiconductor integrated circuit that incorporates a microprocessor or a CPU (central processing unit).

In this example, the VW control circuits 111, 112 operate by the supply voltage VDDQ for the input/output circuits. The input/output circuits 112, 122 use the supply voltage VDDQ for the input/output circuits and the supply voltage VDD for the internal circuits. The power supply can arbitrarily be configured, as long as the VDDQ is used for the data transmission. In this example, if the level conversion circuit described later is not provided inside the input/output circuits 112 and 122, but is provided inside the internal circuits 118 and 128, the power supply of the supply voltage VDD for the internal circuits to the input/output circuits 112, 122 will become unnecessary.

In the master integrated circuit 110, the data to be outputted to outside the integrated circuit from the internal circuit 118 are sent to the input/output circuit 112 through a wiring 113, and outputted to a symbolically illustrated external signal terminal PAD and a transmission line 100. In reverse, the data to be inputted to the master integrated circuit 110 are transmitted to the internal circuit 118 through the external signal terminal PAD, the input/output circuit 112, and a wiring 114.

The VW control circuit 111 has the function capable of selectively controlling the size (namely, the ON-resistance) of the output transistors of an external output buffer contained in the input/output circuit 112. The VW control circuit 111 selectively controls the output transistor size of the external output buffer according to the external power supply voltage VDDQ, in such a direction that the transmission line 100 connected to the external output buffer outside the chip can make the impedance matching with the external output buffer. The example in FIG. 1 judges the matching state of the ON-resistance of the external output buffer with the impedance of the transmission line 100 in a simulated manner by means of a dummy transmission line 1001 for the VW control that is connected to a dummy output terminal DQ, which is not restricted to this. A control signal 115 is a signal group, by which the VW control circuit 111 controls the input/output circuit 112. The VW control circuit 121 of the slave integrated circuit 120 is the same as the VW control circuit 111 in the basic function. A major difference between the VW control circuits 111 and 121 lies in that which one instructs the modification of the supply voltage VDDQ to the voltage control circuit 131, and takes the initiative in the control. In this example, the VW control circuit 111 of the master integrated circuit 110 instructs the modification of the supply voltage VDDQ to the voltage control circuit 131 through the VW control line 140. When the VW control circuit 121 of the slave integrated circuit 120 wants to modify the supply voltage VDDQ, the VW control circuit 121 requests the master integrated circuit 110 to vary the supply voltage VDDQ through the VW control line 140. In this description, the processing function that controls the supply voltage VDDQ and the output transistor size (ON-resistance) of the external output buffer is named simply as VW processing, or VW function.

Figure 2:
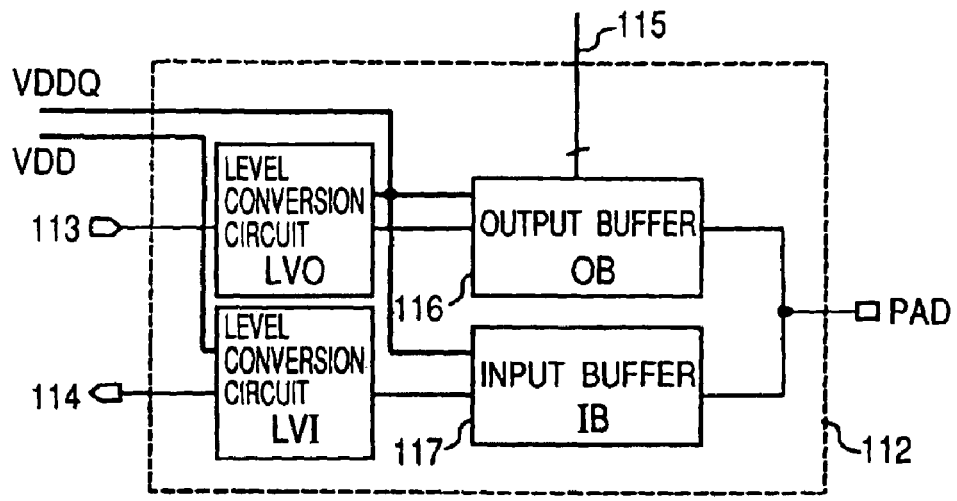
FIG. 2 is a block diagram showing one example of the input/output circuit.

FIG. 2 illustrates an example of the input/output circuits 112. The input/output circuit 112 includes an output buffer 116, an input buffer 117, and level conversion circuits LVO, LVI, although not restricted to these. The output data from the internal circuit 118 are sent to the input/output terminal PAD by the output buffer 116 through the wiring 113. Since the supply voltage VDD for the internal circuit 118 and the supply voltage VDDQ for the output buffer 116 are different, the level conversion circuit LVO becomes necessary which converts a logic voltage amplitude in the internal circuit 118 and a logic voltage amplitude in the output buffer 116. Similarly, the data inputted to the input/output terminal PAD from the outside of the integrated circuit is sent to the internal circuit 118 by the wiring 114 through the input buffer 117. Also in this case, the level conversion circuit LVI converts the difference of the logic voltage amplitudes due to the difference of the supply voltages for the input buffer 117 and the internal circuit 118. The input/output circuit 122 is configured in the same manner.

Figure 3:
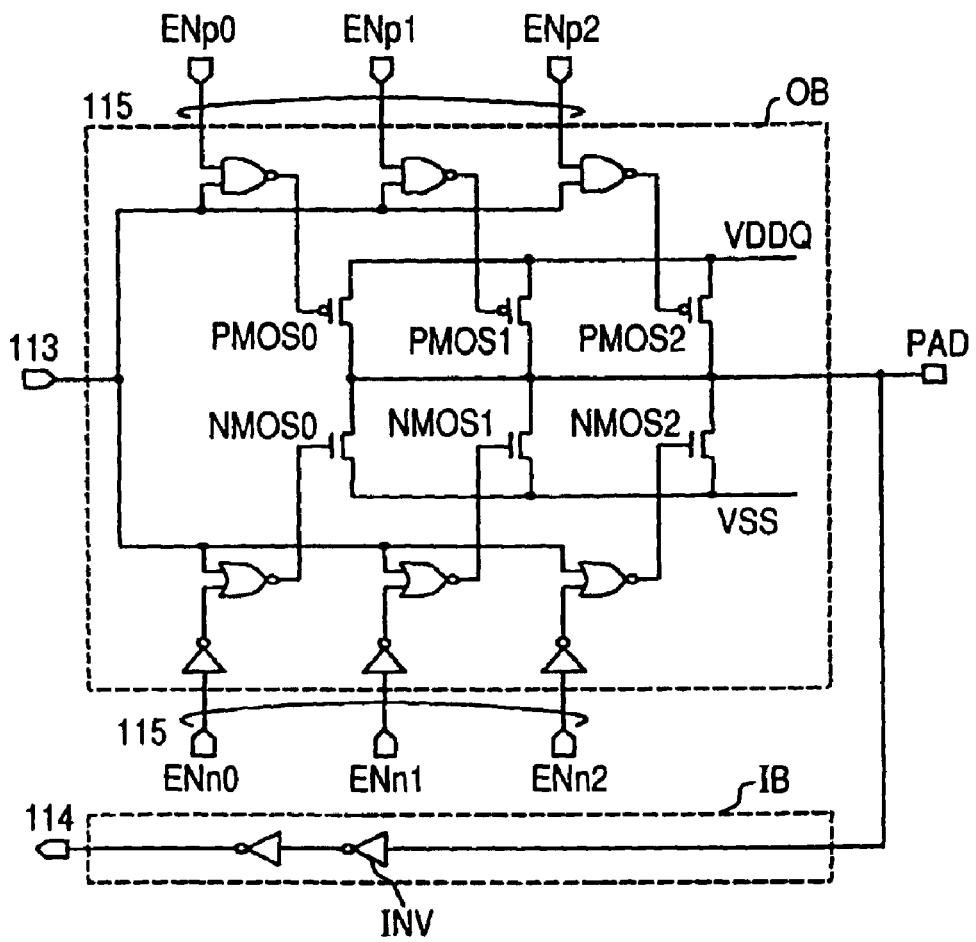
FIG. 3 is a block diagram showing one example of the input buffer and output buffer.

FIG. 3 illustrates an example for the input buffer 117 and an example for the output buffer 116.

The input buffer 117 can be made up with inverters INV cascaded, for example.

The output buffer 116 can be configured so as to connect in parallel the outputs of an inverter formed of an NMOS transistor NMOS0 and a PMOS transistor PMOS0, an inverter formed of an NMOS transistor NMOS1 and a PMOS transistor PMOS1, and an inverter formed of an NMOS transistor NMOS2 and a PMOS transistor PMOS2.

The use of the ON-resistance control signal 115 composed of Enp0, Enp1, Enp2, ENn0, ENn1, and ENn2 makes it possible to arbitrarily change the number of the NMOS transistors and PMOS transistors that are simultaneously brought into operation, and to change the overall ON-resistance of the output buffer 116.

Here, provided the channel length of the transistor is given by L, and the channel width thereof is given by W, and when the transistors are formed in such a manner that the W/L ratio of the NMOS transistors NMOS0, NMOS1, and NMOS2 becomes equal to 1:2:4 (NMOS0:NMOS1:NMOS2), the ON-resistance can be changed in a wider range. In the same manner, it is recommendable to design the PMOS transistors in such a manner that the W/L ratio of the PMOS transistors PMOS0, PMOS1, and PMOS2 becomes equal to 1:2:4.

In this example, in a manner that the ON-resistance of the output buffer 116 can be varied to 7 steps by 3-bit control data, which is not limited to this, the ON-resistance control signal 115 composed of the Enp0, Enp1, Enp2, ENn0, ENn1, and ENn2 is configured so that Enable-controls can selectively be made. The number of the inverters cascaded in parallel is not limited to three stages; and it may be 6 stages in parallel, for example, to control the ON-resistance more in detail. Also, the allocations of the transistor sizes are not limited to the value shown as the example, and it is recommendable to optimize the value according to the manufacturing process and the range of the ON-resistance to be desirably controlled.

FIG. 4 shows an example in which the ON-resistances of NMOS transistors vary in the control of the power supply voltage VDDQ and the transistor size. FIG. 4A shows the variation of the ON-resistances in the master integrated circuit 110, and FIG. 4B shows the variation of the ON-resistances in the slave integrated circuit 120. To simplify the explanation, it is assumed that the supply voltage can be controlled to four stages (1.5V, 1.8V, 2.2V, 2.5V). The differences of the ON-resistances in FIG. 4A and FIG. 4B result from the differences of the transistor characteristics in the master integrated circuit 110 and the slave integrated circuit 120 due to the differences of the manufacturing processes and the like.

With regard to the master integrated circuit 110, any transistors have a common channel length L; and the NMOS transistor NMOS0 has the minimum channel width W of 44 UM, the NMOS transistor NMOS1 has the channel width W of 88 UM, and the NMOS transistor NMOS2 has the channel width W of 176 UM. Here, UM signifies micrometer ($10^{-6}$ m). Similarly, with regard to the slave integrated circuit 120, the NMOS transistor NMOS0 has the minimum channel width W of 40 UM, the NMOS transistor NMOS1 has the channel width W of 80 UM, and the NMOS transistor NMOS2 has the channel width W of 160 UM. The W/L ratio is 1:2:4, which is common to both the master and slave integrated circuits 110, 120.

Hereunder, the signals regarding the control of the NMOS transistors of the ON-resistance control signal 115 will be put together and written as (ENn2, ENn1, ENn0). According to this, a state in the output buffer 116 that the NMOS transistor NMOS0 and the NMOS transistor NMOS2 are in use and the NMOS transistor NMOS1 is not in use, for example, can be expressed as (101). In this state, the channel width of the output buffer 116 in the slave integrated circuit 120 is 200 UM in total.

FIG. 4 confirms that the integrated circuits by different manufacturing processes create differences in the variation ranges and absolute values of the ON-resistances to the supply voltage. In order to achieve the high-speed data transmission, it is necessary to bring the characteristic impedance of the transmission line 100 into a good conformity with the ON-resistance of the output buffer 116. Only lowering the supply voltage in pursuit for lower power consumption does not generally bring the conformity of the ON-resistance with the characteristic impedance of the transmission line, because the ON-resistance characteristics in the master integrated circuit 110 and the slave integrated circuit 120 do not conform. The present invention varies the operational voltages, and at the same time controls the transistor sizes of the integrated circuits 110, 120 each separately, and thereby achieves the impedance matching in both of the master integrated circuit 110 and the slave integrated circuit 120.

Hereunder, the ON-resistance of the NMOS transistor will be explained as an example, but the ON-resistance of the PMOS transistor is the same. Further, on the exercise of the process design and the circuit design such that the ON-resistances of the NMOS transistors become equal to those of the PMOS transistors as much as possible, to use the ON-resistances of either the NMOS transistors or the PMOS transistors as the representative will reduce the number of wirings of the ON-resistance control signal 115.

Figure 5:
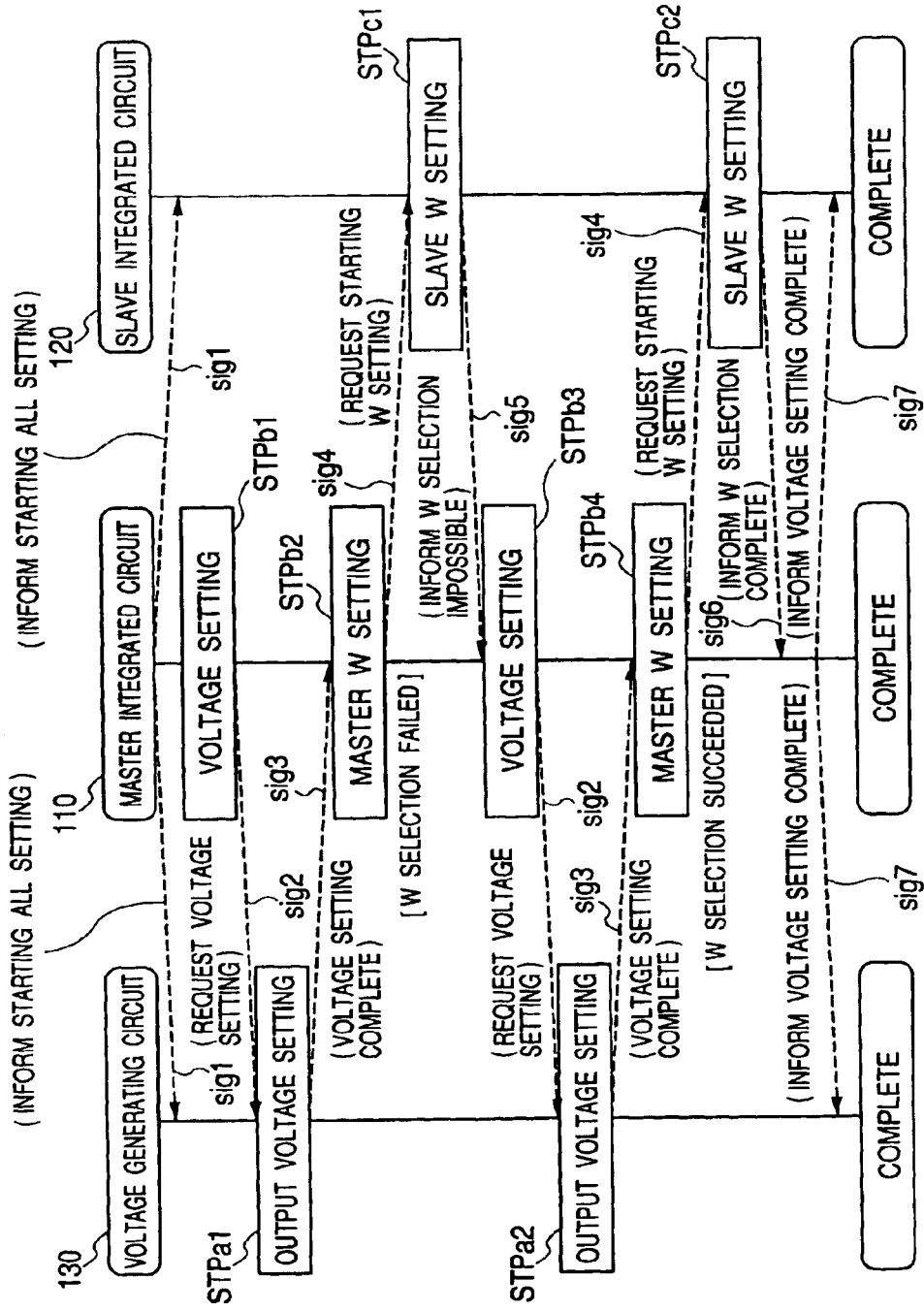
FIG. 5 is a flow chart showing the algorithm for the VW control circuit that enables the impedance matching in both the master integrated circuit and the slave integrated circuit.

FIG. 5 is a flow chart showing the algorithm for the VW control circuit that realizes the impedance matching in both of the master integrated circuit 110 and the slave integrated circuit 120.

At the beginning, the master integrated circuit 110 informs the slave integrated circuit 120 and the voltage generation circuit 130 of starting the VW setting processing by the code signal sig1; and thereby, the master integrated circuit 110 and the slave integrated circuit 120 get into the VW setting mode.

The master integrated circuit 110 requests the voltage generation circuit 130 to set a voltage of VDDQ (for example, 1.5V) by the code signal sig2 (STPb1). The voltage generation circuit 130 sets an output voltage in response to the request (STPa1). The master integrated circuit 110 receives the code signal sig3 that signifies the completion of the voltage setting. Thereafter, the master integrated circuit 110 selects a transistor size W in which the characteristic impedance Z0 (for example, 30 Ω) of the transmission line conforms with the ON-resistance of the output buffer 116 at the supply voltage (STPb1).

When succeeded in the W selection, the master integrated circuit 110 requests the slave integrated circuit 120 to start the W setting by the code signal sig4. Thereby, the slave integrated circuit 120 selects a transistor size W in which the characteristic impedance of the transmission line conforms with the ON-resistance (STPc1). When the slave integrated circuit 120 could not select the transistor size that achieves the impedance matching with the transmission line due to the differences of the ON-resistances by the integrated circuits each, the slave integrated circuit 120 informs the master integrated circuit 110 of the W selection being impossible by the code signal sig5. Thereby, the master integrated circuit 110 requests the voltage generation circuit 130 again to set a voltage of VDDQ (for example, 1.8V) by the code signal sig2 (STPb3).

In response to the request, the voltage generation circuit 130 executes the voltage setting again (STPa2). Being informed of the completion of the voltage setting by the code signal sig3, the master integrated circuit 110 selects a transistor size W (STPb4) again, and requests the slave integrated circuit 120 again to start the W setting by the code signal sig4. The slave integrated circuit 120 decides the transistor size W (STPc2), and when this was successful, the slave integrated circuit 120 informs the master integrated circuit 110 of the completion of the W setting by the code signal sig6. Thus, the master integrated circuit 110 informs the voltage generation circuit 130 and the slave integrated circuit 120 of the completion of the operational supply voltage setting. And, the master integrated circuit 110 and the slave integrated circuit 120 returns to the normal operation mode that accepts data transmissions.

Figure 6:
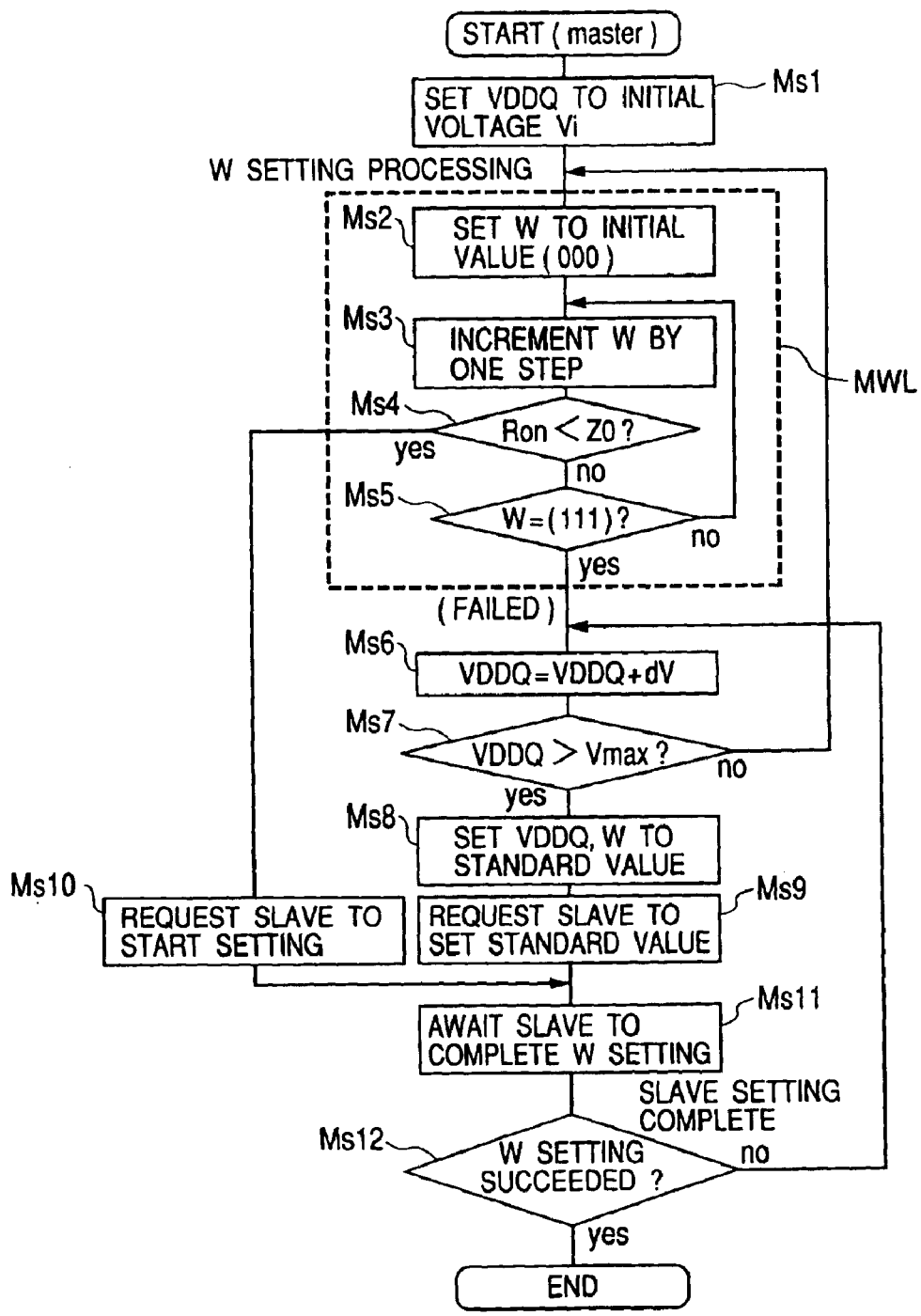
FIG. 6 is a flow chart showing the processing procedure of the VW setting in the master integrated circuit.

FIG. 6 shows the processing procedure of the VW setting in the master integrated circuit. To follow the example shown in FIG. 4, the interfacing supply voltages take discrete values (1.5V, 1.8V, 2.2V, 2.5V), and both the master integrated circuit 110 and the slave integrated circuit 120 are capable of the size selections of 7 steps for the transistor width W that can be designated by 3 bits.

The first step initializes the supply voltage VDD for the input/output circuits to an initial voltage Vi (Ms1). The initial voltage Vi is set to the selectable minimum voltage, and the step enters the selection processing MWL of the transistor size W. The W selection processing MWL initializes the transistor width W to (000) at the beginning (Ms2). While increasing the transistor width one step after one step (Ms3), the step compares the ON-resistance of the output transistor with the target impedance Z0 (Ms4).

Since the ON-resistance decreases as the transistor width is increased, at the moment that the ON-resistance Ron becomes less than the target impedance Z0, the step passes through the W selection processing MWL on the assumption that the W selection was successful. If the ON-resistance does not reach the target impedance (Ms5=yes) even with the transistor width increased to the maximum, the step passes through the W selection processing on the assumption that the setting was unsuccessful. Since the ON-resistance can be decreased further with a higher supply voltage, the step increases the supply voltage by dV (Ms6), and enters the W selection processing again (Ms7=no).

If the W selection processing of the master integrated circuit 110 resulted in achievement of the target impedance (Ms4=yes), the master integrated circuit 110 requests the slave integrated circuit 120 to start the W selection (Ms10). The step waits for the information of the result of the W setting processing in the slave integrated circuit 120 (Ms11); and if the W selection was successful in the slave integrated circuit 120 (Ms12=yes), the step finishes the VW control here. If the W selection was unsuccessful in the slave integrated circuit 120 (Ms 12=no), the supply voltage is increased by dV (Ms6), and the W selection processing (MWL) in the master integrated circuit 110 is again carried out, and next the W selection in the slave integrated circuit 120 is again carried out (Ms10) Here, the dV signifies an arbitrary selectable voltage differential.

When at least one of the master integrated circuit 110 and the slave integrated circuit 120 could not achieve the target impedance, even if the supply voltage was set to the maximum value in the selection range, the step sets the predetermined standard values of the voltage and the transistor size in the master integrated circuit 110 and the slave integrated circuit 120, on the assumption that the whole processing failed (Ms8, Ms9). The standard values of the voltage and the transistor size are only needed to adopt, for example, the condition for maximizing the voltage and the condition for maximizing the size to thereby select all the transistors.

Here, the condition on which the ON-resistance of the transistor is in conformity with the characteristic impedance of the wiring is defined as the size WK, when the ON-resistance of the transistor becomes less than the characteristic impedance of the wiring, while the transistor size is increased one step by one step, like W1=(001), W2=(010), . . . This is better than the transistor size WK-1 directly before the ON-resistance becomes less than the characteristic impedance. The reason is as follows. The ON-resistance decreases as the transistor size is increased on the condition of the same supply voltage. However, the decreasing rate of the ON-resistance becomes smaller gradually, in case the ratio of the transistor size is 1:2:4. Therefore, the WK has a higher probability than the WK-1, in which the ON-resistance becomes more approximate to the characteristic impedance.

Figure 7:
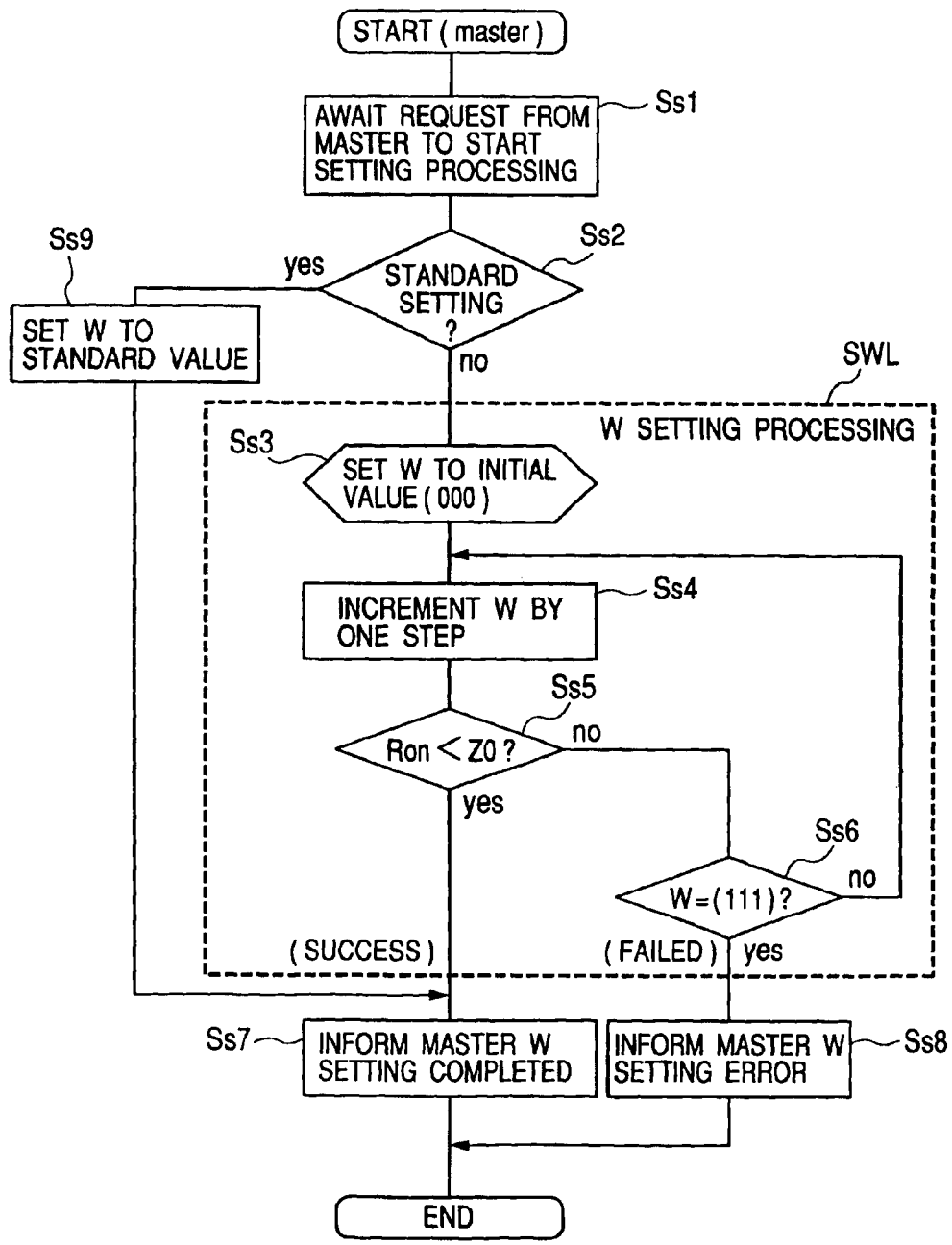
FIG. 7 is a flow chart showing the processing procedure of the VW setting in the slave integrated circuit.

FIG. 7 shows the processing procedure of the VW setting in the slave integrated circuit 120. First, the slave integrated circuit 120 is on standby until it receives the request from the master integrated circuit 110 to start the W setting (Ss1). After receiving the request, the slave integrated circuit 120 carries out the same W setting processing as that of the master integrated circuit 110 (SWL). That is, the SWL processing initializes the transistor size W to the minimum value at the beginning (Ss3). While increasing W one step after one step (Ss4), the step compares the ON-resistance Ron with the target impedance Z0 (Ss5). At the moment that the ON-resistance becomes less than the target impedance (Ss5=yes), the step finishes the W setting, and informs the master integrated circuit 110 of the completion of the W setting (Ss7) If the ON-resistance does not become less than the target impedance with W set to the maximum (Ss6=yes), the step informs the master integrated circuit 110 of the W setting error (Ss8), and waits until the slave integrated circuit 120 receives the request to start the W setting or the standard value setting from the master integrated circuit 110.

Further, the step Ss2 judges whether or not there is the request for the standard value setting from the master integrated circuit 110; and if yes, the slave integrated circuit 120 carries out the standard setting of W (Ss9).

Figure 8:
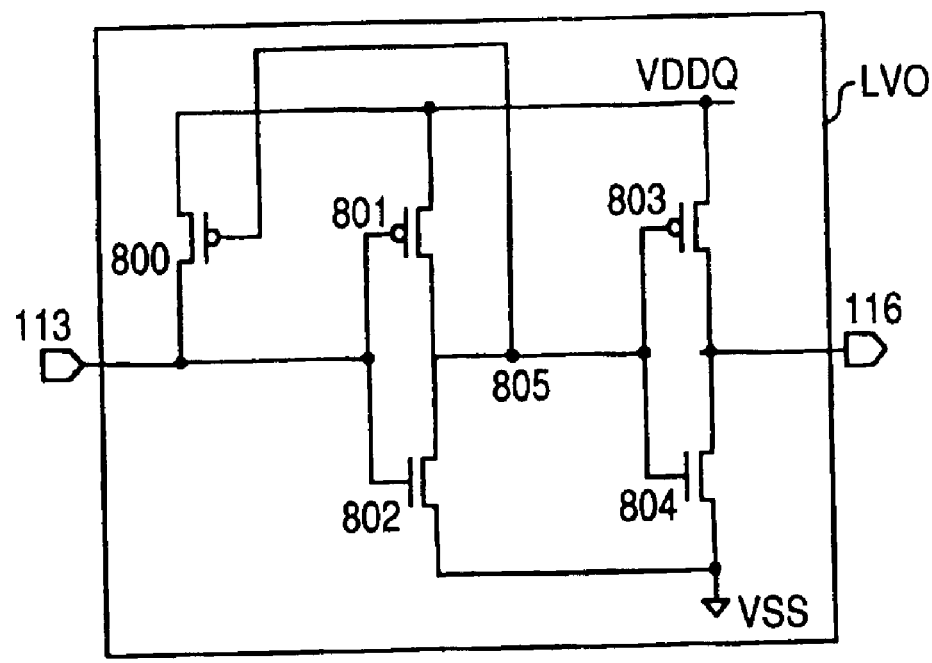
FIG. 8 is a level conversion circuit on the post-stage of the input buffer.

FIG. 8 illustrates an example of the level conversion circuit LVO. The level conversion circuit LVO includes an inverter composed of MOS transistors 801, 802 at the first stage, and an inverter composed of MOS transistors 803, 804 at the second stage, which are connected in series. Since the supply voltage VDD to the internal circuit 118 is generally lower than the supply voltage VDDQ to the output buffer 116, there is a possibility such that the terminal 113 connected with the internal circuit 118 cannot supply a sufficiently high voltage to the inverter at the first stage, when the logical value is "1" (High level). Therefore, the voltage at an internal terminal 805 is fed back to the gate of a PMOS transistor 800. This circuit converts the output data 113 from the internal circuit 118 into the signal amplitude of the supply voltage VDDQ for the input/output circuit.

Figure 9:
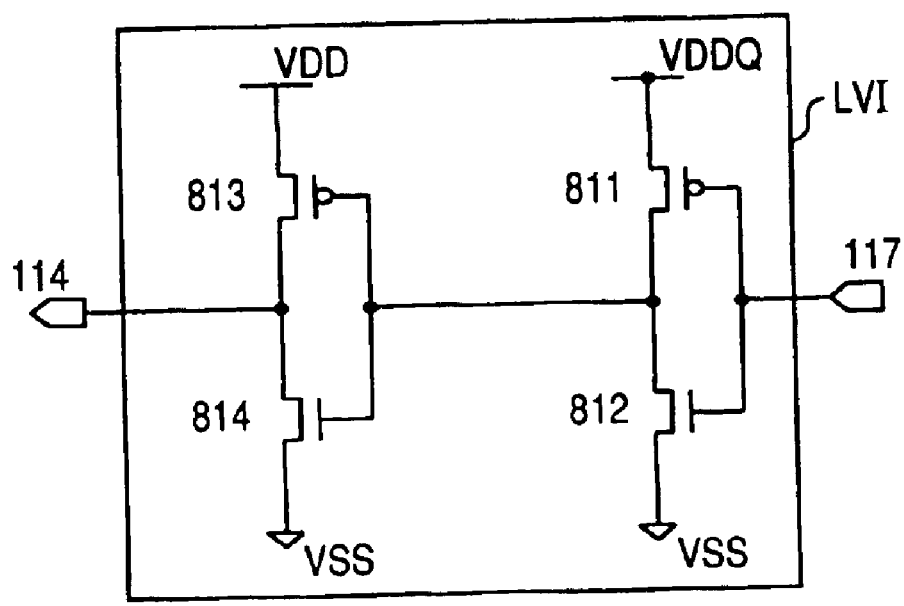
FIG. 9 illustrates an example of the level conversion circuit LVI.

FIG. 9 illustrates an example of the level conversion circuit LVI. The level conversion circuit LVI includes an inverter composed of MOS transistors 811, 812 at the first stage, and an inverter composed of MOS transistors 813, 814 at the second stage, which are connected in series. Since the supply voltage VDD to the internal circuit 118 is generally lower than the supply voltage VDDQ to the input buffer IB, which is reverse to the level conversion circuit LVO, the wiring for the feedback and so forth are not especially needed. This circuit converts the logical voltage amplitude VDDQ of the input data signal 117 to the input buffer IB into the logical level of the supply voltage VDD for the internal circuit 118.

[VW Control Circuit]

Next, the VW control circuit and the timing of the impedance comparison will be described in detail.

Figure 10:
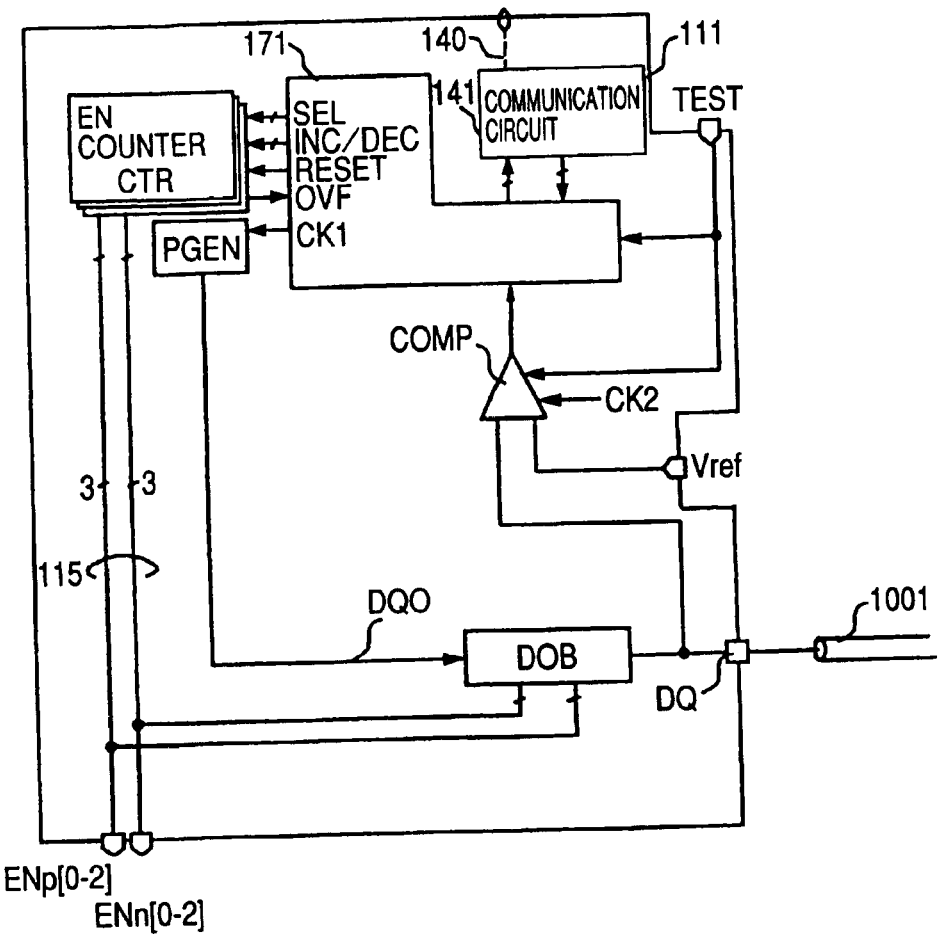
FIG. 10 is a block diagram showing the VW control circuit.

FIG. 10 shows an example of the VW control circuit. The VW control circuit 111 includes a dummy output buffer DOB being the same circuit (the circuit in FIG. 3) as the output buffer 116 inside the input/output circuit 112, a dummy output terminal DQ, a VW control logic circuit 171, a communication circuit 141, a comparator COMP, a counter CTR, and a pattern generator PGEN. The ON-resistances of the dummy output buffer DOB are made selectable by means of the control signal 115, the same as the one to the output buffer 116. The numerical symbol 1001 denotes the dummy transmission line connected to the dummy output terminal DQ. In viewing from the transmission terminal, the terminal end of the dummy transmission line 1001 is terminated with a capacitor of the ESD protection circuit or the like, but it can be regarded as being open. However, the interval of td in FIG. 11, which is explained later, becomes short when the wiring length is short, and the timing difference between CK1 and CK2 has to be designed with sufficient attentions.

The VW control circuit 111 is a logical circuit that implements the algorithm for setting the supply voltage and the transistor size, which has been explained based on FIG. 5 through FIG. 7. The currently selected values of the supply voltage and the transistor size are stored in the binary counter CTR inside the VW control circuit 111. This example only needs 2-bit counter for storing the supply voltages, 3-bit counter for storing the NMOS transistor sizes, and 3-bit counter for storing the PMOS transistor sizes. The counter CTR may use a normal binary counter, or a Gray code counter.

As it is clear from the algorithm based on FIG. 5 through FIG. 7, the VW control logic circuit 171 inputs and outputs a signal SEL for selecting a voltage value counter and a transistor size counter, a signal INC/DEC for increasing and decreasing a counter value, a signal RESET for initializing the counter value, a signal OVF for indicating the overflow of the counter value, and so forth.

According to the algorithm based on FIG. 5 through FIG. 7, the VW control logic circuit 171 has the function that compares the ON-resistance (Ron) of the output buffer 116 with the reference impedance (Z0) to determine the comparison result. For example, the data pattern generator PGEN outputs a step signal synchronized with the signal CK1 to the dummy output terminal DQ, to which the wiring 1001 having the reference impedance Z0 is connected; and the comparator COMP compares the signal voltage outputted to the dummy output terminal DQ with a reference voltage Vref. The reference voltage Vref may be supplied from the voltage generation circuit 130, or it may be generated inside the integrated circuits 110, 120 on the basis of the operational supply voltage VDDQ.

Figure 11:
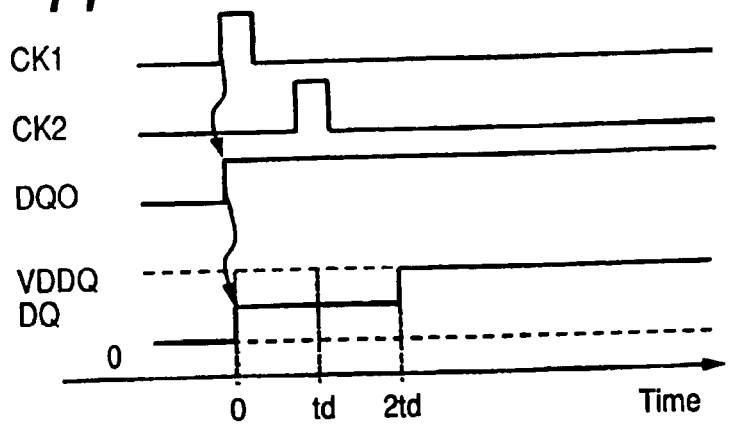
FIG. 11 is a timing chart illustrating the operational timing in the impedance comparison operation.

FIG. 11 illustrates the operational timing in the impedance comparison. The data pattern generator PGEN sends a signal to rise from 0 to VDDQ to the wiring DQO by means of the signal CK1. The rise signal in DQO is outputted to the dummy output terminal DQ, through the dummy output buffer DOB. When the far end of the wiring 1001 is open, the rise signal totally reflects on the far end of the wiring 1001. Assuming that the time for the signal to transmit the wiring 1001 is td, during 2 td from the time 0 when the signal rises at the dummy output terminal DQ through the time when the totally reflected signal returns to the dummy output terminal DQ again, the output voltage at DQ is equal to VDDQ*Z0/(Ron+Z0), that VDDQ is divided by the ON-resistance Ron of the PMOS transistor of the output buffer DOB and the impedance Z0 of the wiring 1001. The comparator COMP compares the voltage at the dummy output terminal DQ with Vref by means of the signal CK2 having a delay of more than 0 less than 2 td against CK1. Now, assuming that Vref=VDDQ/2, the voltage at the dummy output terminal DQ is lower than Vref when Ron is larger than Z0; and when Ron is smaller than Z0, the voltage at DQ is higher than Vref. Thereby, the magnitude of the ON-resistance of the transistor and the target impedance can be judged.

In the same manner, a constant resistance R=Z0 may be used instead of the wiring 1001. Naturally, the method of comparing the ON-resistance with the target impedance is not limited to this, and the other method may be applied.

A signal TEST in FIG. 10 is the signal that permits the operations of the VW control logic circuit 171 and the comparator COMP. During the VW setting period, for example, during the interval from the start of all setting to the completion of all setting in which the processing in FIG. 5 through FIG. 7 is carried out, the signal TEST permits the operation. When the operation is permitted by the signal, the master integrated circuit 110 is defined as being in the first mode, and the slave integrated circuit 120 is defined as being in the second mode.

Figure 12:
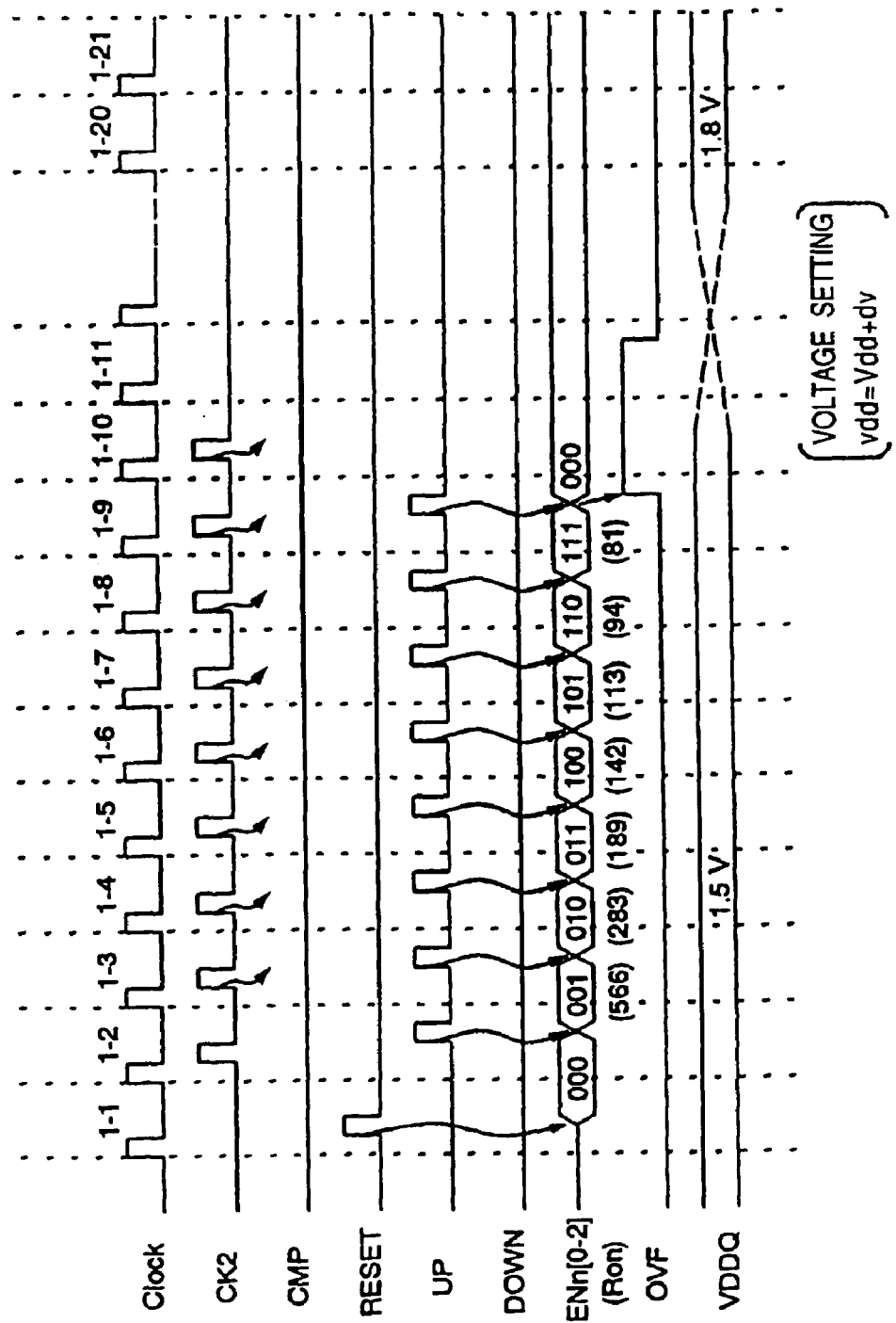
FIG. 12 through FIG. 14 are timing charts showing the VW control that uses the ON-resistances shown by A1, B1, A2, and B2 in FIG. 4 as an example.
Figure 13:
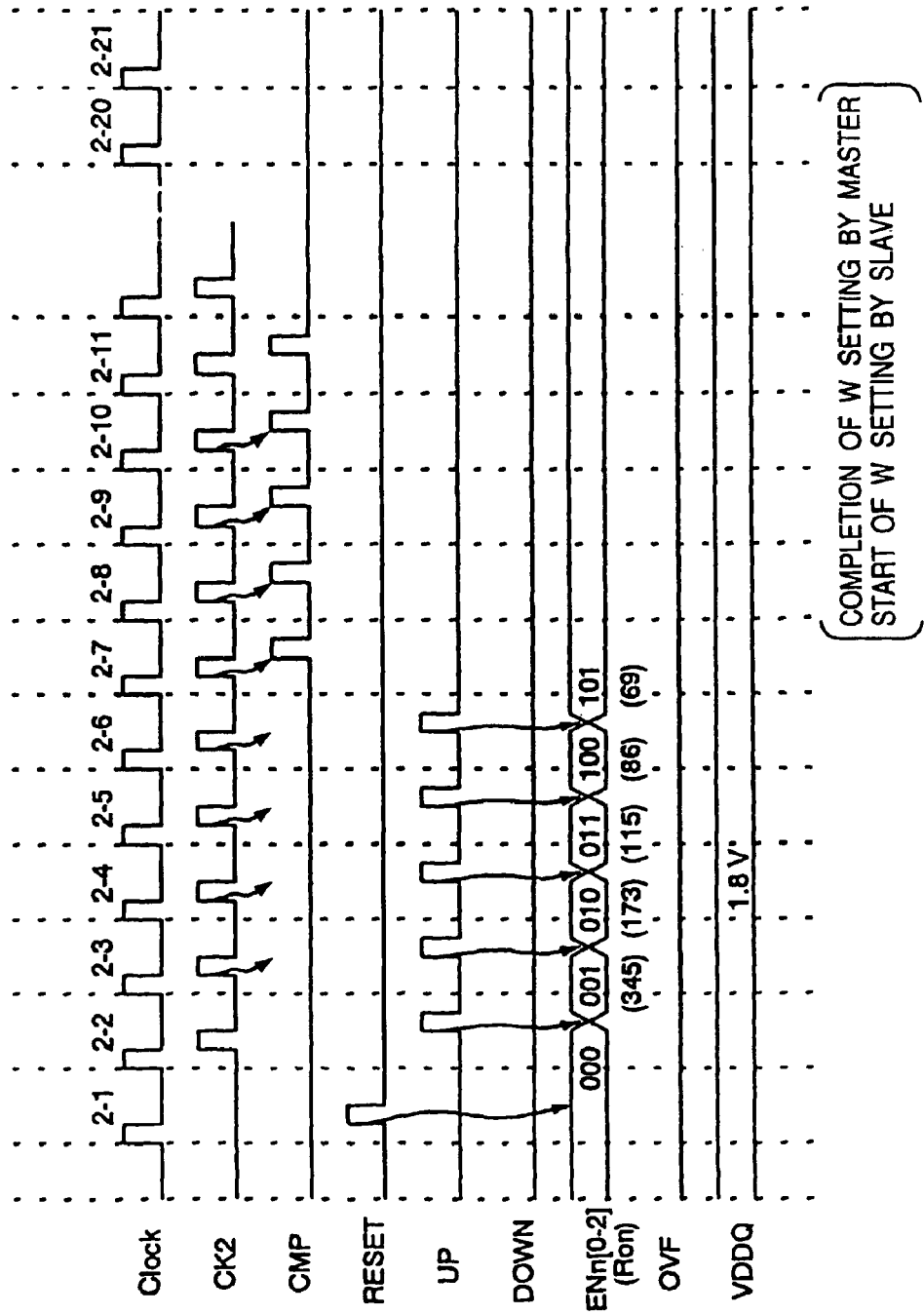
Figure 14:
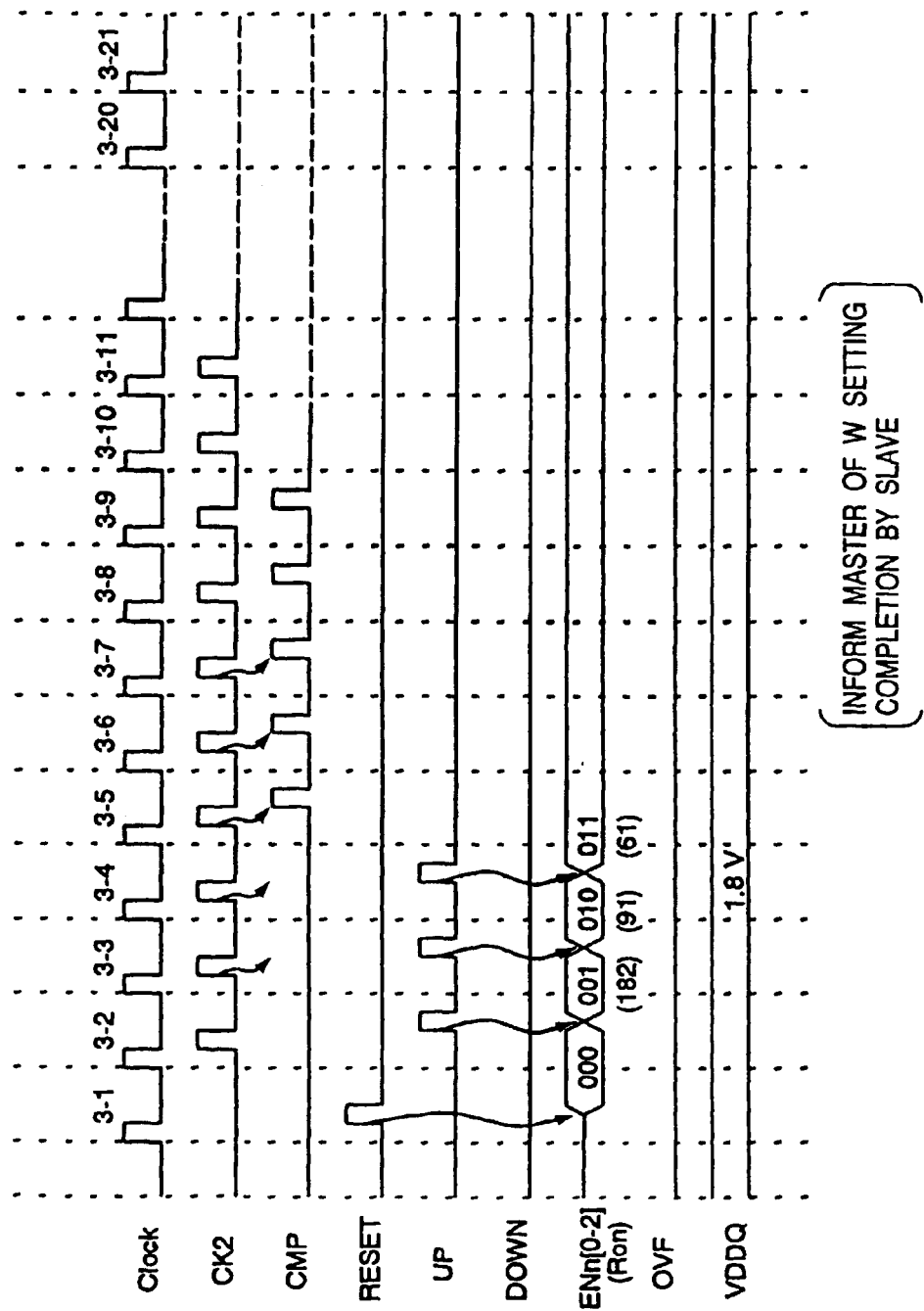

FIG. 12 through FIG. 14 illustrate the timing charts of the VW control using the ON-resistances shown by A1, B1, A2, and B2 in FIG. 4 as an example. The processing procedure of the VW control according to this invention will be explained further in detail, with the ON-resistances in FIG. 4 as an example. FIG. 12 illustrates the setting procedure of the ON-resistances of the NMOS transistors. The initial supply voltage starts with 1.5V. The target impedance is assumed as Z0=70 Ω. Therefore, the resistances A1 and A2 surrounded by round marks are to be selected.

In the NMOS transistors of the master integrated circuit, the signal RESET clears the ENn0 through ENn2 (ENn [0–2]) all to zero (000) at the time 1-1 in FIG. 12. At the time 1-2, a signal UP increments ENn[0–2] to (001). The ON-resistance at this moment is 566 Ω. When the comparator COMP compares the ON-resistance of the output buffer inside the VW control circuit with the target impedance, the ON-resistance is larger than the target impedance 70 Ω; accordingly, the comparator COMP delivers zero output. Consequently, the signal UP increases the counter of ENn [0–2] by one step to decrease the ON-resistance. Thereby, ENn[0–2] becomes (010), and the ON-resistance becomes 283 Ω at the time 1-3. Thereafter, the signal UP increases the counter one step after one step, while checking the output of the comparator COMP, so as to approximate the ON-resistance to the target impedance. As the result, ENn [0–2] becomes (111) at the time 1-8, and the ON-resistance decreases to 81 Ω, but it does not reach the target impedance. At the time 1-9, as the signal UP increments the counter by one step, the counter overflows to output the signal OVF. Receiving this, the master integrated circuit 110 increases the supply voltage from 1.5V to 1.8V. The following processing will start at the time 1-20 and after, when the supply voltage is stabilized.

FIG. 13 illustrates the timing flow after the supply voltage becomes 1.8V. First, the signal RESET clears ENn[0-2] to (000) at the time 2-1. Thereafter, in the same manner as FIG. 12, the increment signal (signal UP) increases the counter CTR one step after one step to decrease the ON-resistance, while the output of the comparator COMP is zero. At the time 2-6, when ENn[0–2] becomes (101), the ON-resistance becomes 69 Ω. Here at the first time, it becomes less than the target impedance 70 Ω. Therefore, the output of the comparator COMP becomes High level at the time 2-7 and after, and the W setting processing is completed in the master integrated circuit 110. Accordingly, the master integrated circuit 110 requests the slave integrated circuit 120 to start the W setting processing.

FIG. 14 illustrates the state of the W setting processing in the slave integrated circuit 120, when the supply voltage is set to 1.8V. At the time 3-1, ENn[0–2] in the slave integrated circuit 120 is initialized to (000). Thereafter, in the same manner as in the master integrated circuit 110, the ON-resistance is compared with the target impedance. At the time 3-4, the ON-resistance becomes 61 Ω, which is smaller than the target impedance; and at the time 3-5, the output of the comparator COMP delivers High level. Here, the VW selection processing is completed. The NMOS transistor size of the master integrated circuit 110 is 220 UM (code (101)), and the NMOS transistor size of the slave integrated circuit 120 is 120 UM (code (011)), at the supply voltage 1.8V.

When the target impedance is set to 40 Ω, to execute the VW selection according to the processing procedure in FIG. 5 through FIG. 7 will attain the ON-resistances shown by B1 and B2 surrounded by round marks in FIG. 4.

FIG. 15 shows an example of the code signals in the communication circuit 141. In the communication circuit 141, the bit number and format are specified as the communication code for use in requests and answers between the integrated circuits. The communication code may be transmitted in one clock cycle, by forming the communication line 140 in a sufficiently wide bus of 12 bits, for example. Alternatively, the communication code may be transmitted by means of plural clocks, by forming the communication line 140 with fewer wiring lines.

In FIG. 15, the column To shows the codes for the integrated circuits to receive the communications, the column From the codes for the integrated circuits to transmit the communications, the column What (contents of communications) the codes for the instructions according to the communications, and the column Code example the codes to be allocated to the communication contents each. Here, as the ID number for the integrated circuits, 000 is allocated to all the integrated circuits (the master integrated circuit 110, the slave integrated circuit 120, and broadcasting to the voltage generation circuit 130), and 111 is allocated to the voltage generation circuit 130. To the slave integrated circuit 120, for example, 001 may be allocated. In case there are plural slave integrated circuits, the ID numbers have to be allocated not to overlap each other.

[Consideration for Error Rate]

FIG. 16 shows an example of a VW control circuit 111A capable of the VW control in consideration for the transmission error rate. In general, to lower the supply voltage by the VW control creates a possibility that decreases the immunity to noises such as voltage fluctuations. When highly reliable data transmissions have to be ensured while the power consumption is lowered, the circuit construction as shown in FIG. 16 enables the power consumption to be lowered with reliable data transmissions ensured. There is a difference between FIG. 16 and FIG. 10, as follows. To the wiring 1001 used for transmissions and receptions of data signals, a pseudo-random pattern generator PRPG is employed to transmit pseudo-random pattern signals, on the transmitting side; and on the receiving side, a comparator ECCCOMP is employed to compare the signal received from the input buffer 117 with the output from the pseudo-random pattern generator PRPG locally provided, and an error counter ECNT is employed to count the frequency of errors.

The VW control circuit on the transmitting side turns a switch 1002 to the output buffer DOB side to send data. The VW control circuit on the receiving side turns the switch 1002 to the comparator ECCCOMP side to compare the input data and the random pattern. To a constant data pattern length, the counter ECCCOMP or the like counts the frequency of inconformity for both; and when the frequency of errors is greater than a predetermined error rate, the voltage VDDQ is increased by one step. After the voltage VDDQ is increased, the error rate is counted again, and if necessary, the voltage VDDQ is increased again.

Figure 17:
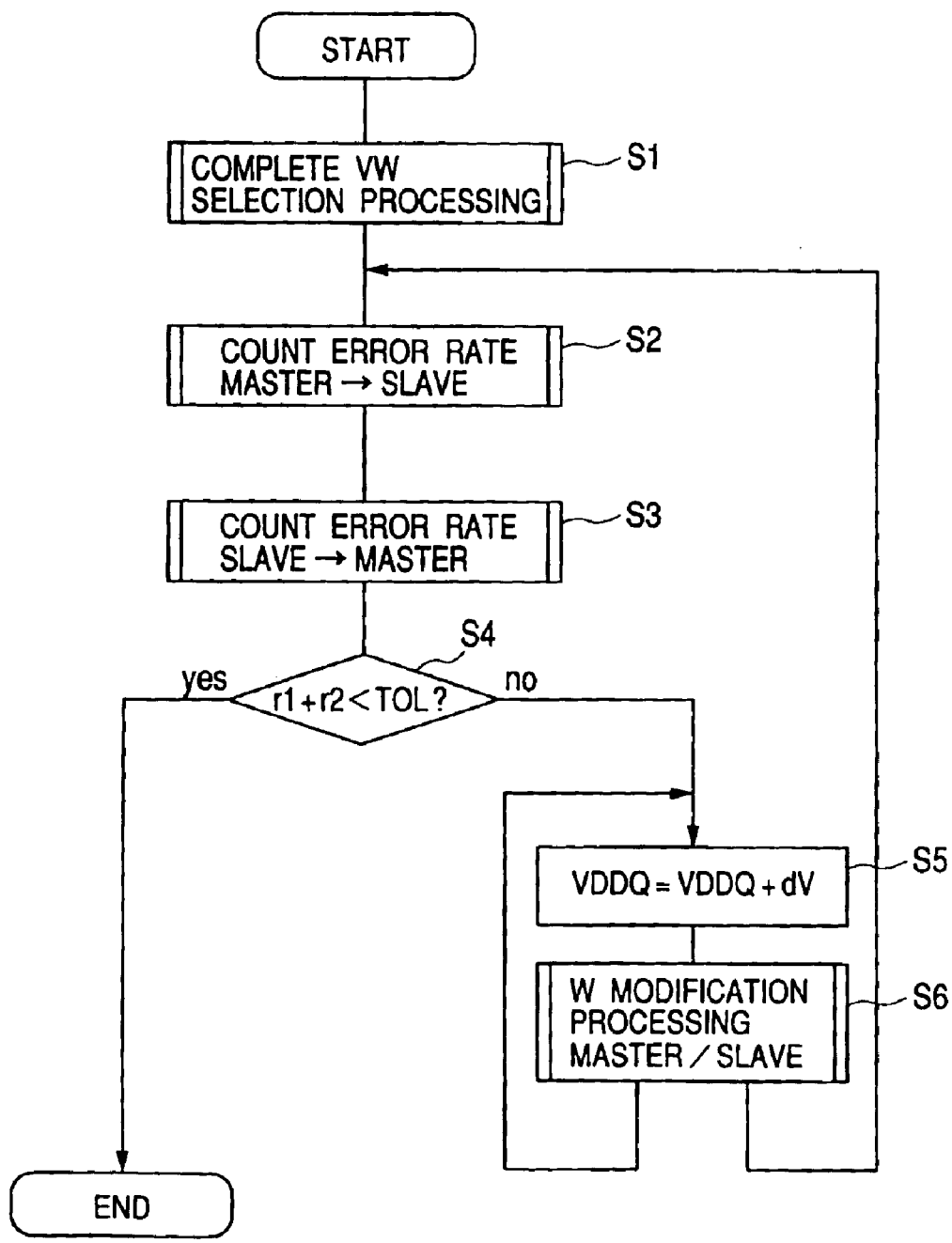
FIG. 17 is a flow chart showing the processing procedure of the VW setting that uses the circuit construction in FIG. 16.

FIG. 17 shows an example of the processing procedure of the VW setting that uses the circuit construction in FIG. 16. The first step executes the complete adjustment of the voltage and the transistor size as shown in FIG. 5 (S1). Thereafter, in case the transmission error is adapted to the VW control, for example, the test pattern generator PGEN is made to generate a known data pattern. When the data pattern is transmitted from the master integrated circuit 110 to the slave integrated circuit 120, the step counts an error rate r1, in the slave integrated circuit 120 (S2); and when the data pattern is transmitted from the slave integrated circuit 120 to the master integrated circuit 110, the step counts an error rate r2, in the master integrated circuit 110 (S3). Until the sum of the error frequencies for both directions becomes smaller than a predetermined TOL, the supply voltage VDDQ is increased to count the error rate repeatedly (S4, S5, S6). The processing at steps S5, S6 is basically the same as the one already explained in FIG. 5, and the detailed explanation thereof will be omitted.

Figure 18:
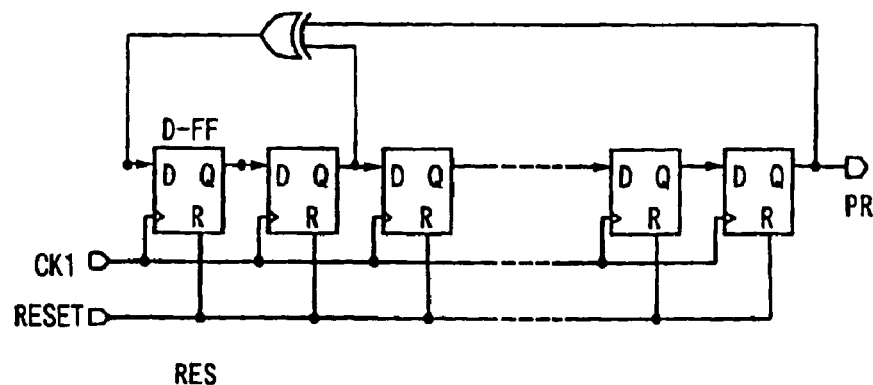
FIG. 18 is a logic circuit of a quasi-random pattern generator using the M-sequences.

The known data pattern involves a necessity to generate the same pattern in both the master integrated circuit 110 and the slave integrated circuit 120. For this can be used the pseudo-random pattern generator using the M-sequence as shown in FIG. 18, for example. To provide the pseudo-random pattern generator inside the VW control circuit 111 will make it possible to design a pseudo-random pattern length on the equilibrium of the reliability and the setting time. That is, if there are a large number of bits of a long pseudo-random pattern, it will enhance the reliability for error detection; but in reverse, it will require more processing time for setting the voltage and transistor size.

Figure 19:
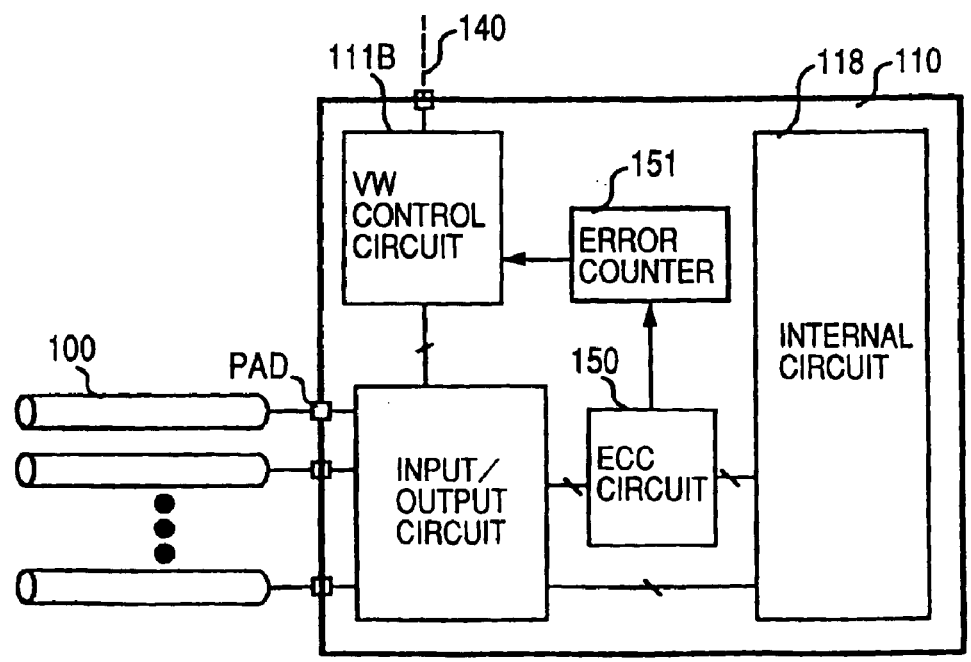
FIG. 19 is a block diagram of an integrated circuit that brings the ECC into function during operation and measures the error rate.

The pseudo-random pattern generator PGEN inside the VW control circuit may be used not for the counting of the error rate, but it may be used for the VW control using the error rate in the actual data transmission, as shown in FIG. 19. That is, during the actual operation, an ECC (error detection/correction circuit) 150 is brought into function, and an error counter 151 is made to count the error frequency. When the error frequency reaches a specified value, a VW control circuit 111B is used to adjust the voltage and the transistor size. The VW control circuit 111B controls the VW setting processing in consideration for the transmission error, when the coefficient values of the error counter 151 are supplied to the VW control logic circuit 171 in the construction in FIG. 10. In this manner, to use the error rate based on the actual conditions of data transmissions will enhance the reliability for the data transmissions.

[Intermittent VW Adjustment to Accommodate Environmental Variations]

Figure 20:
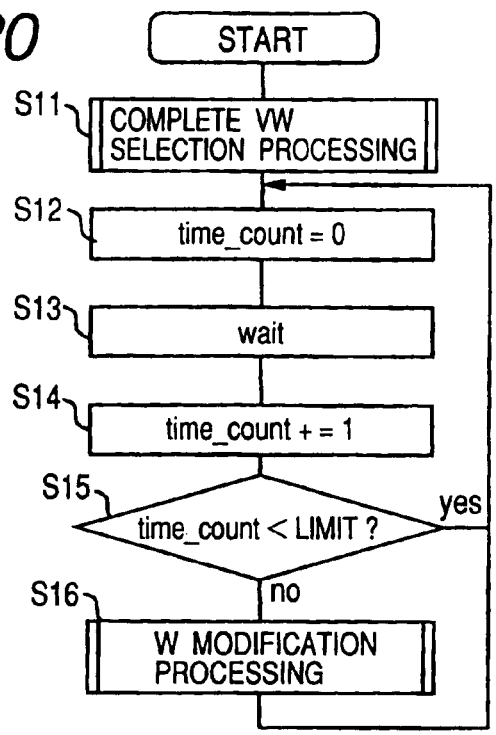
FIG. 20 is a flow chart showing the processing procedure in the adjustment of the voltage and the transistor size, for making the impedance matching to accommodate the environmental variations, etc.

FIG. 20 shows an example of the processing procedure in the adjustment of the voltage and the transistor size, for making the impedance matching to accommodate the environmental variations, etc. In the processing procedure shown in FIG. 20, after the whole system is powered, or after the whole system is reset, the complete adjustment of the voltage and the transistor size, as explained based on FIG. 5 through FIG. 7, have to be made (S11). And thereafter, the following intermittent adjustments should be carried out, in case there occurs a necessity to accommodate the environmental variations such as the temperature rise of LSIs, etc., due to the operation of the system. For example, a counter time_count for monitoring the time is cleared to zero, after the complete adjustment as shown in FIG. 5 through FIG. 7 (S12). A waiting is placed for a constant time such as 10 cycles of the clock (S13), and then the counter time_count is incremented (S14). Whether the counter time_count reaches a specified upper LIMIT or not is checked (S15); and if yes, the control signal 115 for adjusting the transistor size will be modified by one bit (one step) if needed (S16).

Normally, the temperature variation is gradual in the rise or fall; accordingly, to carry out the modification by one bit with an appropriate frequency will sufficiently accommodate the temperature variation and the like. Since the temperature of LSI reaches a constant value along with the operation, it is needed to reach the optimum value by repeating several times the modification by one bit at each upper LIMIT. It is not necessary to set the LIMIT to an extremely low level, in an effort not to create the overhead of adjustment by setting the LIMIT extremely small. However, it is natural that some cases have to increase the upper LIMIT of the counter, or some cases should make an adjustment with 2 bits or more, in a super high-speed system that always requires an optimum adjustment.

The DRAM requires a periodical refreshing processing. Therefore, to carry out the adjustment by one bit immediately after the refreshing will save providing a particular timer and the like. Similarly in the processors, to carry out the adjustment after the fixed operation modes will necessarily save adjusting at a fixed period.

Figure 21:
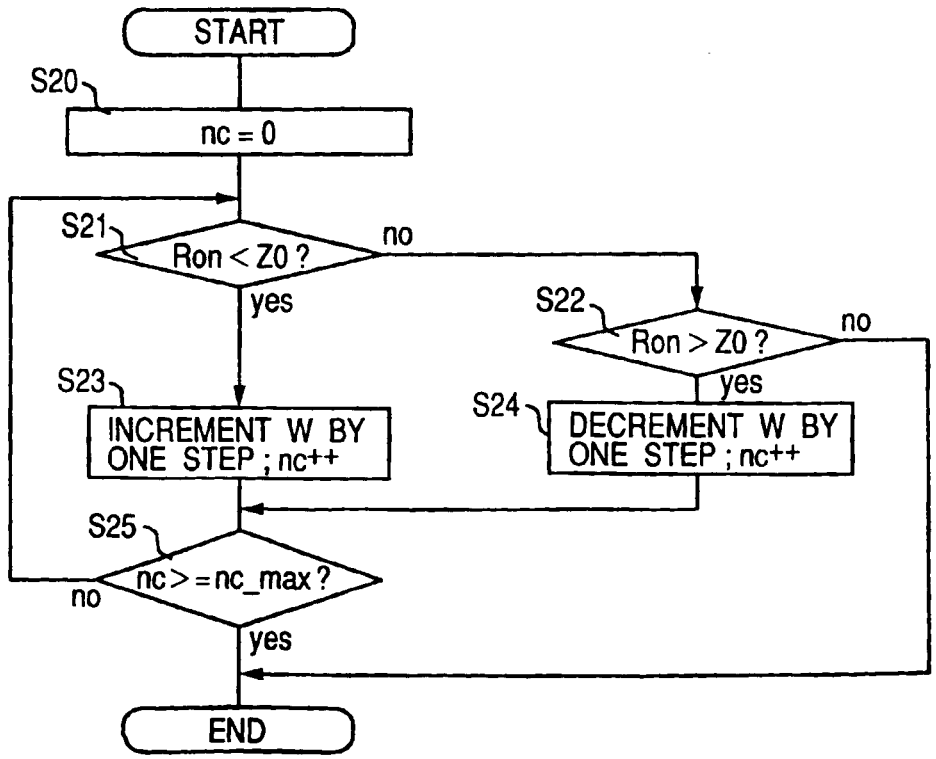
FIG. 21 is a flow chart showing the processing procedure that limits the number of steps to modify MOS transistor selection signals in the W-modification processing.

FIG. 21 illustrates a control flow that limits the number of steps to modify the signal 115 (ENp0 through ENp2, ENn0 through ENn2) in the W-modification processing S16.

In the W-modification processing (S16 in FIG. 20), the step sets "0" to the variable (or register) nc of a work area in the VW control logic circuit 171 (S20), and judges whether Ron<Z0 or Ron>Z0 with regard to the ON-resistances Ron of the MOS transistors contained in the dummy output buffer DOB and the impedance of the dummy transmission line 1001 (S21, S22). If Ron<Z0, the counter CTR is incremented by +1 to increase W by one step (S23); and if Ron>Z0, the counter CTR is decremented by −1 to decrease W by one step (S24). When the W modification processing is limited to the modification by one step, nc_max=1 is needed to be initially set; and when the W modification processing is limited to the modification by i steps, nc_max=i is needed to be initially set. After S23 or S24, the step judges nc>nc_max (S25), and determines whether the modification by the defined number of steps is completed. If it does not reach the defined number of steps, the processing returns to the step S20 to carry out the W modification again.

Figure 22:
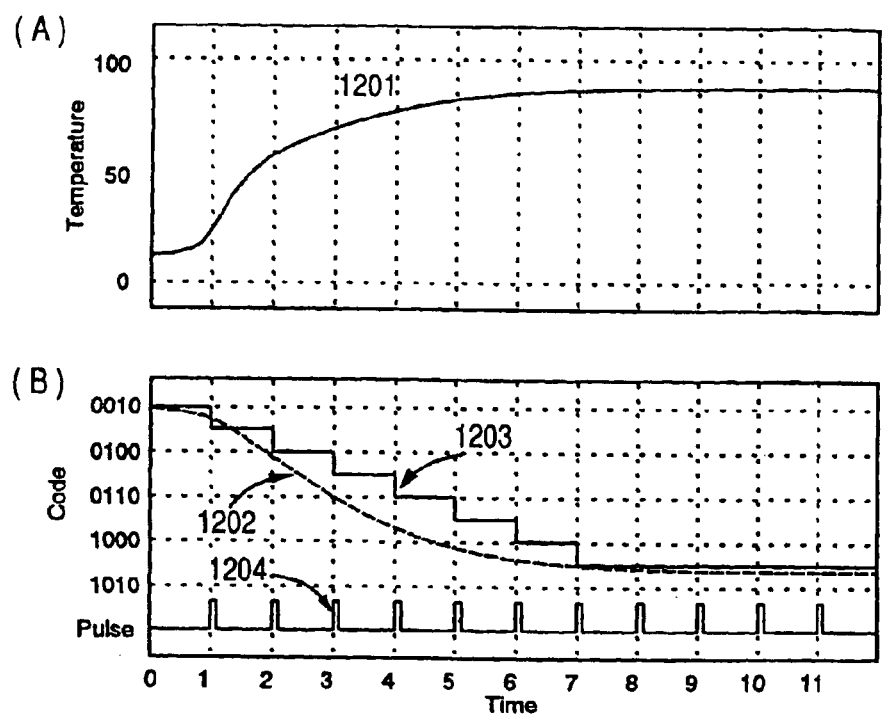
FIG. 22 is a chart explaining a concrete example of the intermittent ON-resistance adjustment in one bit by one bit.

FIG. 22 illustrates a concrete example of the intermittent ON-resistance adjustment in one bit by one bit. The curve 1201 in FIG. 22A illustrates the temperature variation of the system. The stepped line 1203 in FIG. 22B illustrates the control code ENni or ENpi of the ON-resistance. In this case, the control code of the ON-resistance is composed of 4bits.

At the time 0 being the operation starting time of the system, the ON-resistance is adjusted to the ideal value 1010, by the complete adjustment of the operational supply voltage VDDQ and the transistor size, as explained in FIG. 5 through FIG. 7. As the time advances, the temperature of the master integrated circuit 110 and the slave integrated circuit 120 rises from the temperature at the time 0, and reaches a constant value around the time 7. As the temperature rises, generally the ON-resistance of the transistor increases. In order to compensate this variation, it is ideal to change the control code so as to vary along with the ideal value shown by the inclined line 1202.

To realize this, for example, the compensation of the ON-resistance and so forth should be made intermittently, as explained based on FIG. 20. The compensation is made at each time defined by the update pulse signal 1204. At each update pulse, whether the current ON-resistance is an appropriate value or not is checked, and the ON-resistance adjustment by each bit is carried out. Since the adjustment width is one bit, the ON-resistance does not always conform to the ideal value. However, the error is as small as one or two bits, and the operation does not have any troubles. Whether the ON-resistance is an appropriate value or not can be detected by carrying out all or a part of the W setting processing.

Normally, the temperature of the system reaches a stationary value, since the temperature variation becomes gradual as the operation continues. Therefore, if there is a time when the compensation of the ON-resistance by one bit is not sufficient, it will be adjusted to the optimum value along with the time. In case of a high-speed data transmission, a slight deviation of the ON-resistance will create reflections to cause malfunctions, and the update time interval should be designed shorter accordingly. In reverse, in case it is known in advance that the temperature variation is gradual, the update interval of the control code can be expanded.

It is very effective for the application of this invention to make programmable the update interval LIMIT of the control code, or the number of control bits BMAX ($nc\_max$ in FIG. 21) that can be updated at one time, in pursuit for determining the update interval at the optimum during the execution. Because, to modify the update interval or the number of the bits that can be updated at one time will enable the system to operate always by the optimum control code. For example, as the difference between the current control code and the ideal control code becomes larger, it is only needed to shorten the update interval, or to increase the number of the bits that can be updated at one time. It is not necessarily required to directly detect the difference between the current control code and the ideal control code. It can be determined indirectly by using the estimated values of the power consumption according to the operation modes of the semiconductor integrated circuits.

Figure 23:
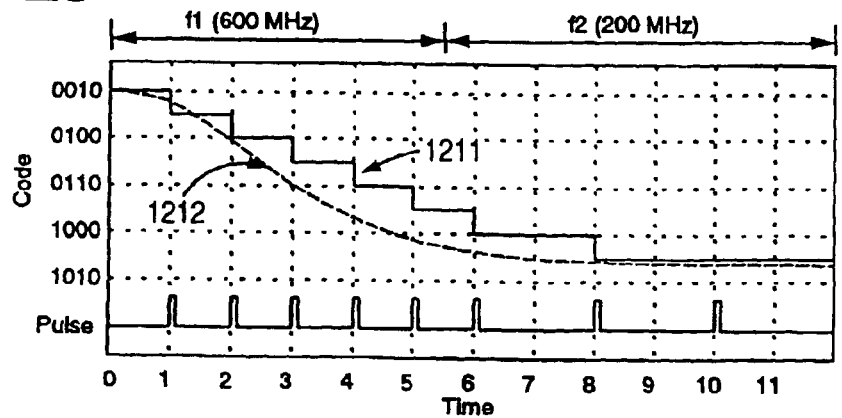
FIG. 23 is a chart showing an example of modifying the update interval of the control code according to the transmission frequency.

Also, when the data transmission frequency is varied dynamically, it is ideal to make the update interval of the control code modifiable according to the transmission frequency during the execution. FIG. 23 illustrates an example of modifying the update interval of the control code according to the transmission frequency. In FIG. 23, the interval f1 corresponds to an interval for the high-speed data transmission, and the interval f2 corresponds to an interval for the low-speed data transmission. The stepped line 1211 shows the control code actually selected, and the curve 1212 shows the ideal control code.

In FIG. 23, the intermittent adjustment interval is changed by each data transmission frequency. That is, in FIG. 23, the update interval of the control code in the interval f2 is doubled to the update interval of the control code in the interval f1. In the interval f1, the update of the control code is carried out at each time by each step, but in the interval f2, the update of the control code is carried out only at the even times (the time 6, 8, 10), and the update is not carried out at the odd times. In order to change the adjustment interval in this manner, it is only needed to modify the setting of the upper LIMIT in FIG. 20.

As this example shows, to design the update interval of the control code shorter when the operational frequency is high, and design it longer when the operational frequency is low will lead to a satisfactory design that enhances the accuracy of the ON-resistance with a moderate frequency of the update.

The reason is as follows. In general, as the frequency of the data transmission is higher, the power consumption becomes larger. This will produce a tendency to raise the gradient of the temperature variation. At the same time, this will not allow the disturbances of the transmission waveforms due to reflections and so forth, especially in the high-speed data transmission. When the frequency of the data transmission is low in reverse, the power consumption becomes small. This will make the temperature variation gentle, and at the same time tolerate the disturbances of the transmission waveforms due to reflections and so forth, according to the degree that the frequency is low.

Figure 24:
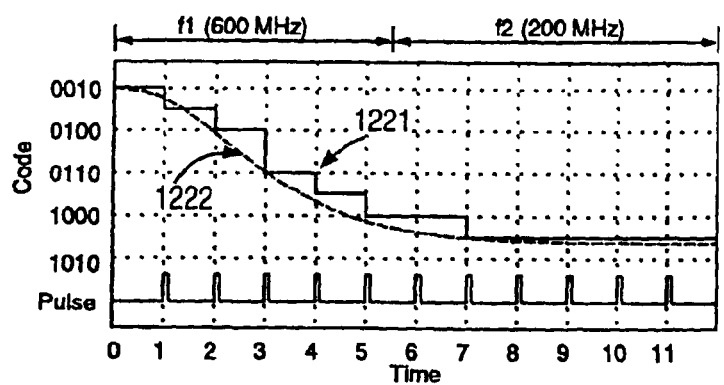
FIG. 24 is a chart showing an example of modifying the number of adjustment bits by each data transmission frequency.

FIG. 24 illustrates an example of modifying the number of adjustment bits by each data transmission frequency, which modifies the update bit number of the control code without changing the update interval. In FIG. 24, the stepped line 1221 shows the control code actually selected, and the curve 1222 shows the ideal control code. The maximum update bit is two bits in the interval f1, and it is one bit in the interval f2. Therefore, the update by two bits at the time 3 achieved the selection of substantially ideal control codes throughout the times. To change the adjustment bit number is only needed to modify the setting of the upper limit $nc\_max$.

As understood from FIG. 24, to modify the update bit number of the control code will make it possible to maintain the difference between the ideal control code and the actually selected control code always small. It is also possible to combine the modification of the update interval in FIG. 23 and the modification of the update bit number in FIG. 24, if necessary.

[Several Modes of the Data Processing System]

Figure 25:
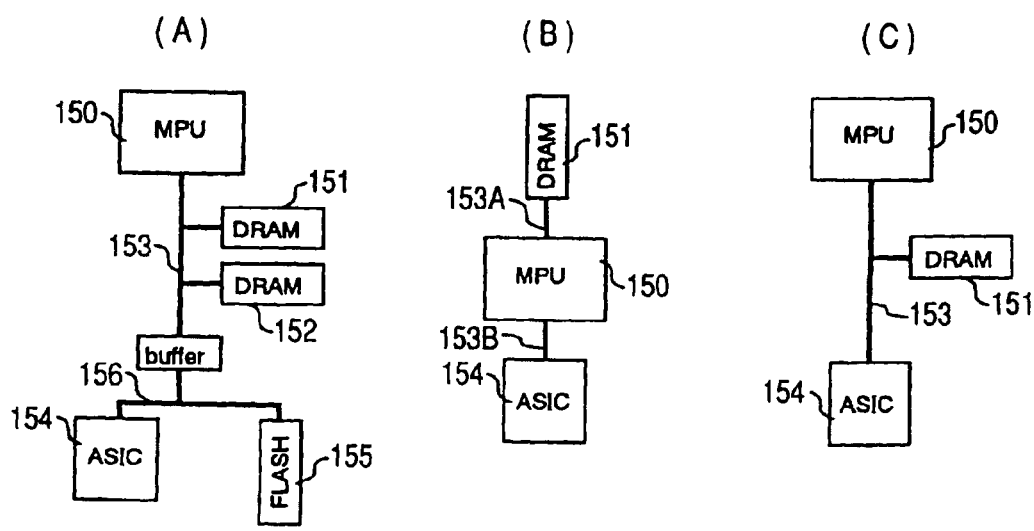
FIG. 25 shows block diagrams for simplified modes of the data processing system to which the semiconductor integrated circuit of the invention is applied.

FIG. 25 shows several examples of simplified modes of the data processing system to which the semiconductor integrated circuit of the invention is applied. In FIG. 25A, a microprocessor (MPU) 150 and DRAM 151, 152 are connected to a bus 153, a dedicated logic 154 composed of an ASIC and a flash memory 155 are connected to the bus 153, and the bus 153 for both and the flash memory 155 are interfaced through a shared buffer 156. This is applied to the system for a digital still camera, for example. In this example, the master integrated circuit 110 can be adapted to the MPU 150, and the slave integrated circuit 120 can be adapted to the DRAM 151, 152.

In FIG. 25B, the DRAM 151 and the ASIC 154 are connected through dedicated buses 153A, 153B, respectively, to the MPU 150. In this case, the master integrated circuit 110 can be adapted to the MPU 150, and the slave integrated circuit 120 can be adapted to the DRAM 151 and the ASIC 154. The modes in FIG. 25B and FIG. 25C are applied to the mobile information terminal and the network terminal, etc.

Figure 26:
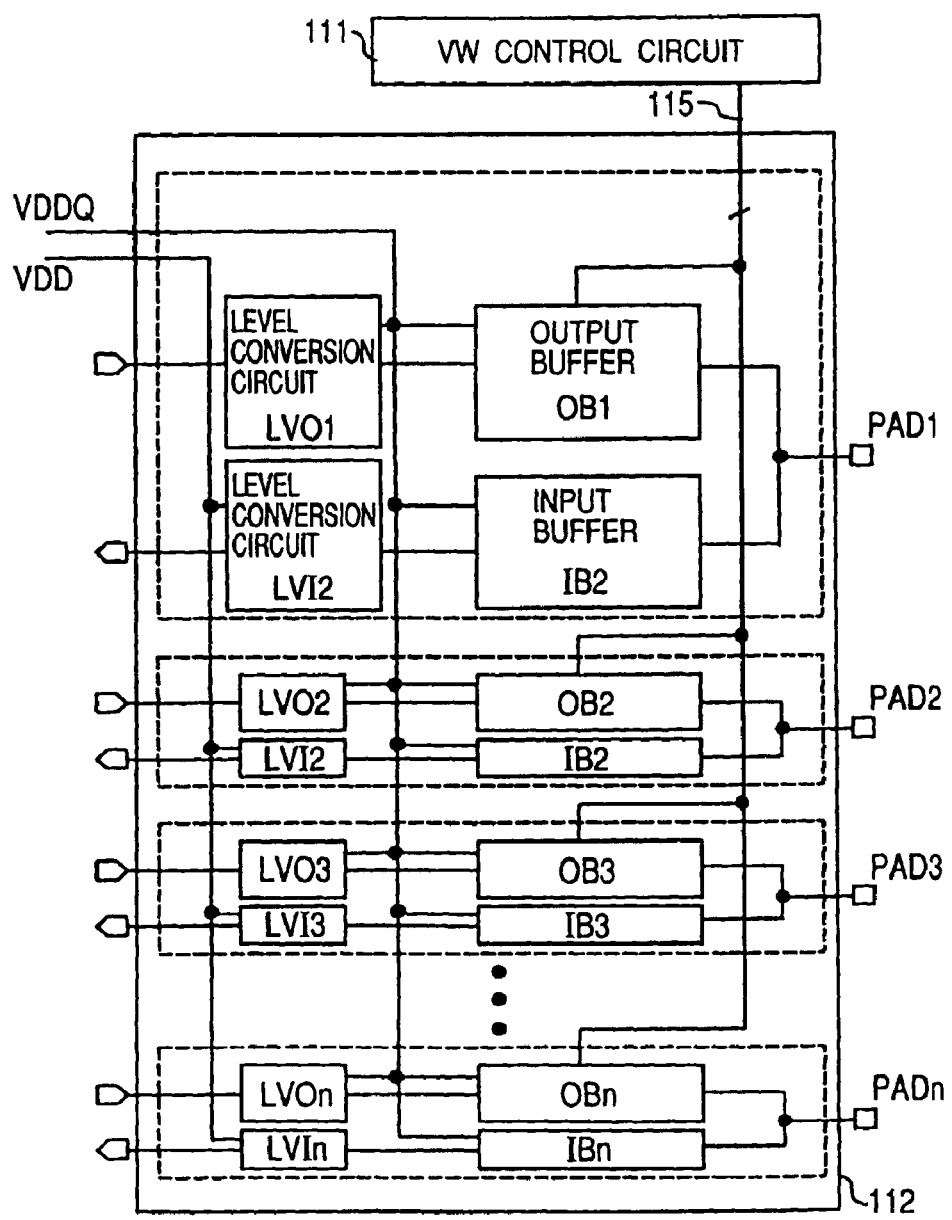
FIG. 26 is a block diagram illustrating the construction of an input/output circuit that includes plural data transmission lines.

FIG. 26 illustrates the construction of an input/output circuit that includes plural data transmission lines (n lines) The control signals 115 can be shared among plural data transmission lines, since there are very limited dispersions between transistors adjacently located on a semiconductor integrated circuit. When the output circuits are located on both ends of the semiconductor integrated circuit at the worst event, or when an extremely high-accuracy impedance matching is needed, it is recommendable to provide the VW control circuit 111 to each of adjacently located output circuits at plural positions. This case involves the trade-off between the increase of the size and the impedance matching.

Figure 27:
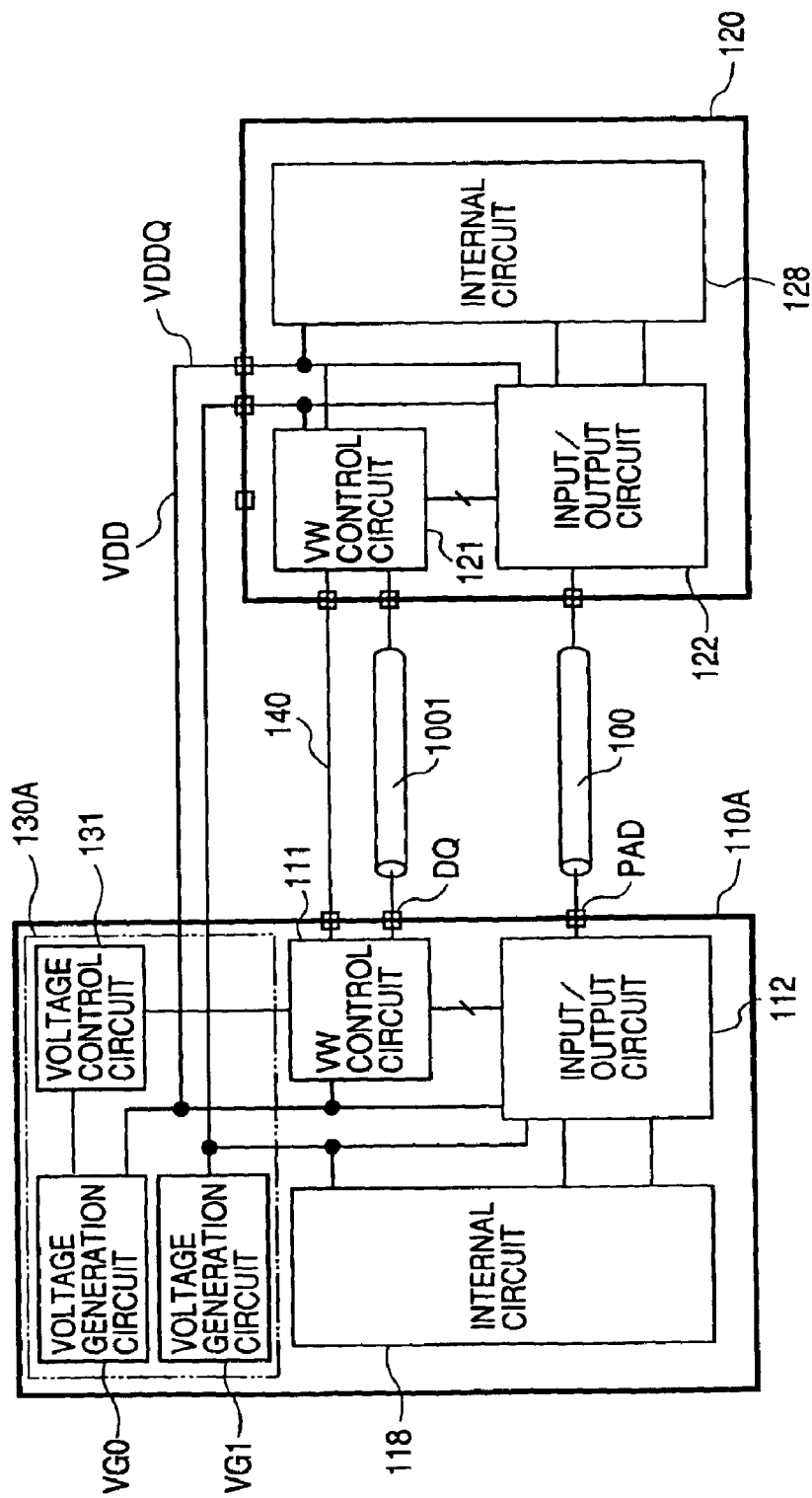
FIG. 27 is a block diagram illustrating an example of the master integrated circuit that incorporates the supply voltage generation circuit.

FIG. 27 illustrates an example of the master integrated circuit that incorporates the supply voltage generation circuit. A supply voltage generation circuit 130A is integrated on the same chip with a master integrated circuit 110A. This construction simplifies the order of inputting the power, and facilitates the board designing and the system designing accordingly. It also simplifies the communication line 140 between the integrated circuits and the contents of communications (for the board/system designer). It is difficult for the current technology to realize the integration of en efficient power supply that provides the power for the data transmission; however, it can be realized without a problem, in case the bit width of the data transmission is narrow.

Figure 28:
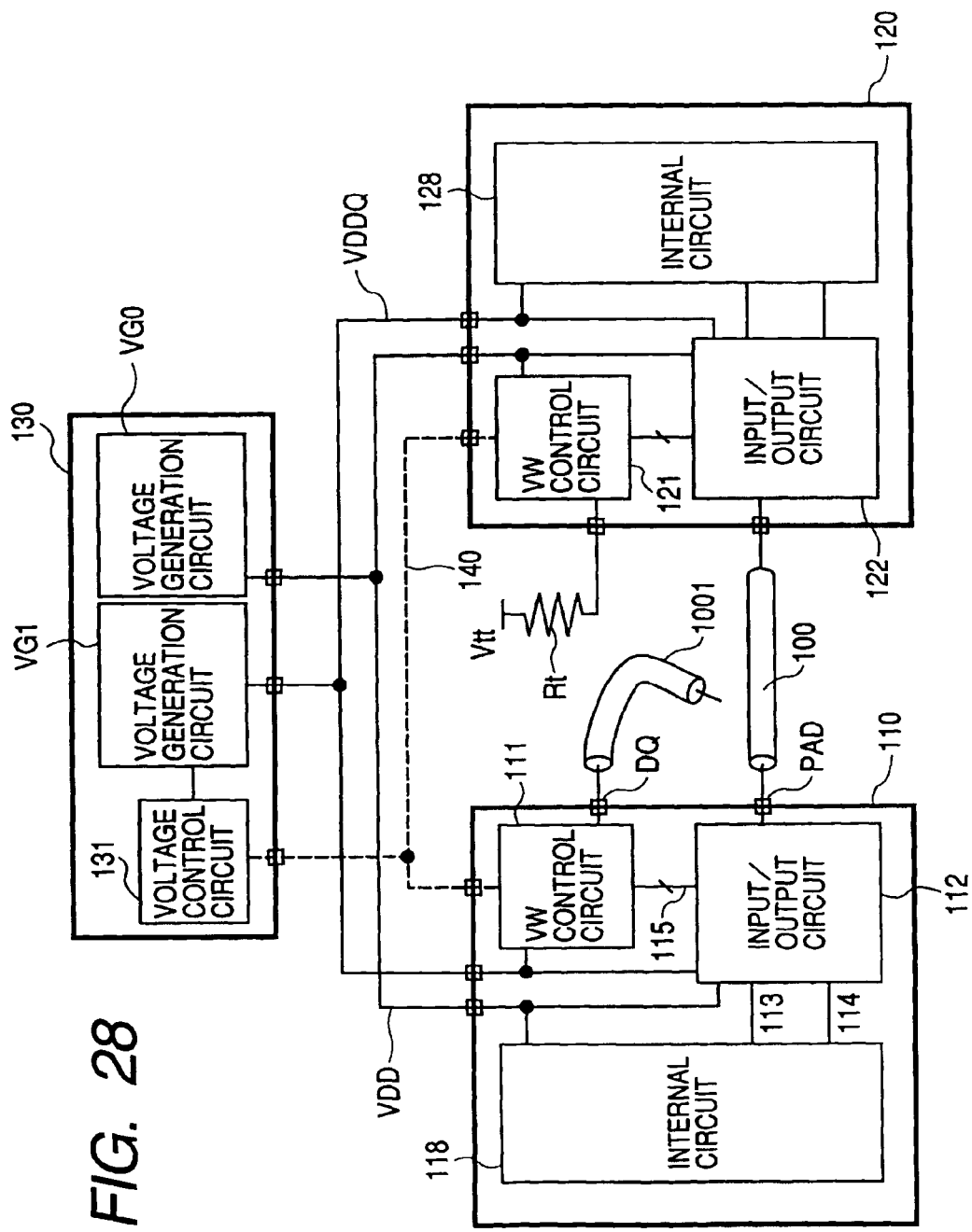
FIG. 28 is a block diagram illustrating an example that uses a dummy transmission line made of a long wiring with the terminal open.

As illustrated in FIG. 28, the dummy transmission line 1001 made of a long wiring can be used with the terminal open. Using the long wiring elongates the interval td shown in FIG. 11, which will relieve the timing to determinate the impedance matching. As illustrated on the side of the slave integrated circuit 120 in FIG. 28, a resistor RT (Z0) having the same characteristic impedance of the wiring may be used in replacement of the dummy transmission line 1001.

Figure 29:
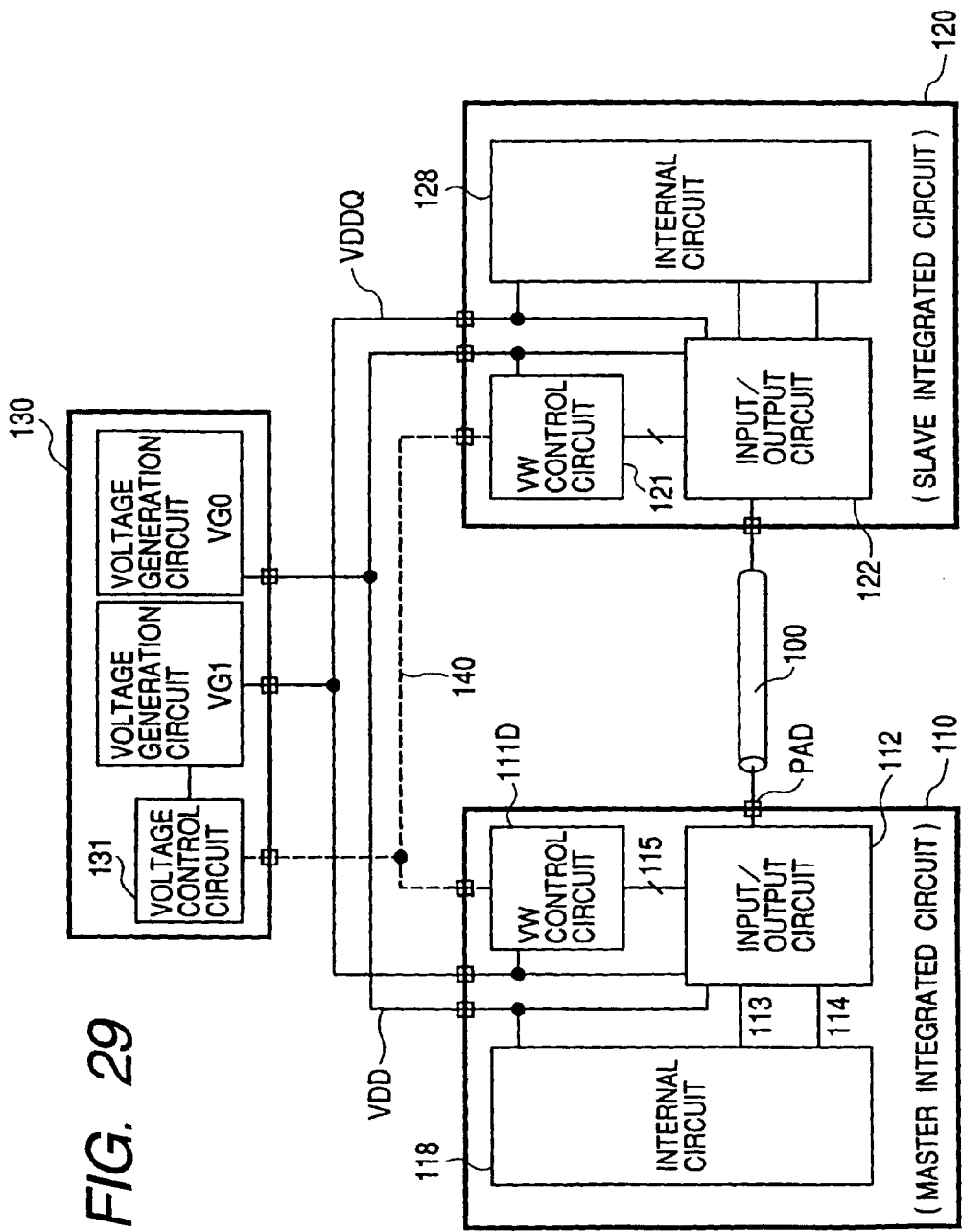
FIG. 29 is a block diagram illustrating a system construction that does not use the dummy wiring, but uses the real wiring in the measurement of the impedance matching.

FIG. 29 illustrates a system construction that does not use the dummy wiring 1001, but uses the real wiring in the measurement of the impedance matching. In this case, a VW control circuit 111D saves the dummy output buffer DOB and the dummy output terminal DQ, compared with the construction in FIG. 10. The VW control circuit 111D may be made capable of selectively connecting the input terminal of the comparator COMP to the input/output terminal PAD1 of one output buffer OB1 of the input/output circuit 112 as illustrated in FIG. 26. Further, the VW control circuit 111D may be configured such that the output of the pattern generator PGEN can selectively be supplied to the one output buffer OB1 as the output data.

Figure 30:
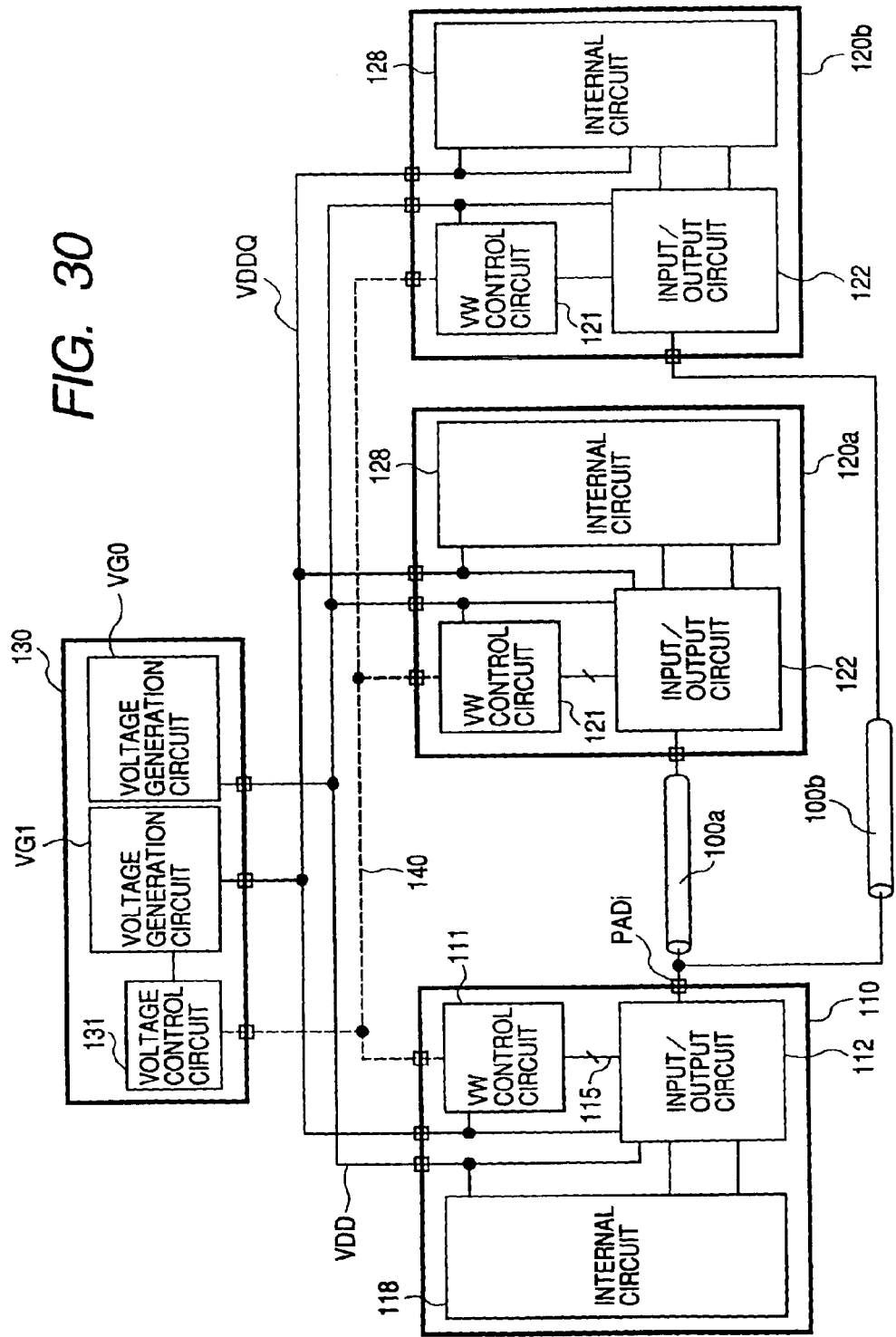
FIG. 30 is a block diagram illustrating a data processing system in which plural slave integrated circuits share the transmission line.

FIG. 30 illustrates a data processing system in which plural slave integrated circuits share the transmission line. The dummy transmission line and the dummy output terminal in the individual integrated circuits are omitted in FIG. 30. A slave integrated circuit 120a is connected through a transmission line 100a to an external terminal PADi of the master integrated circuit 110; and a slave integrated circuit 120b is commonly connected through a transmission line 100b to the external terminal PADi of the master integrated circuit 110.

When there are more than two slave integrated circuits, the correspondence between the master integrated circuit 110 and the slave integrated circuit 120 increases in the procedure of the VW setting control to thereby increase the control quantity only, and the basic control technique is just the same as what is explained in FIG. 5 through FIG. 7.

Figure 31:
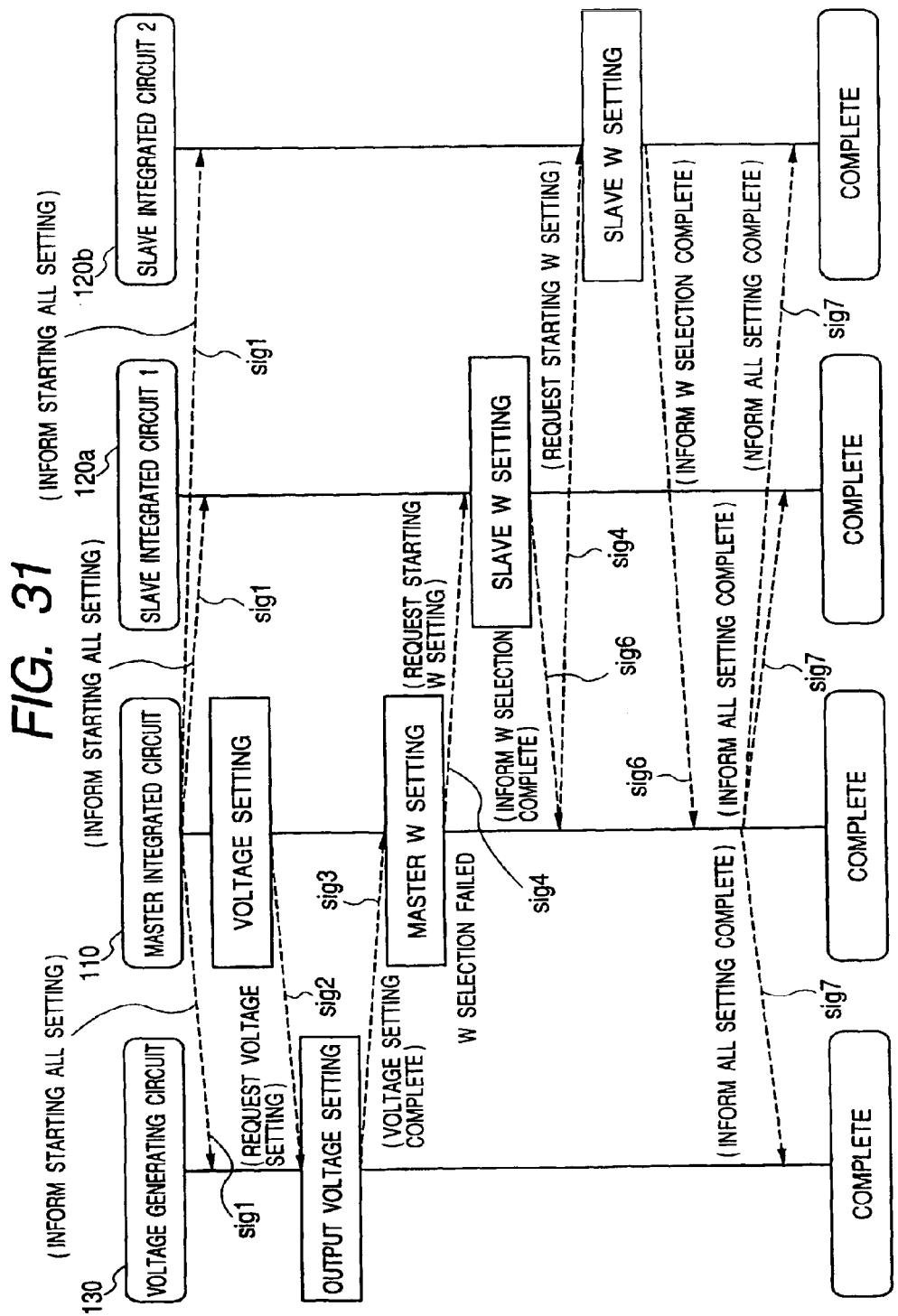
FIG. 31 is a flow chart illustrating a processing procedure of the VW setting, in which all the integrated circuits share the same supply voltage for the input/output circuit.

FIG. 31 illustrates a processing procedure of the VW setting, in which all the integrated circuits share the same supply voltage VDDQ for the input/output circuit. Except for the processing that issues the requesting signal sig4 for starting the W setting to the slave integrated circuits by the number thereof, the same processing as illustrated in FIG. 5 can be applied. As a concrete example can be supposed a system that the master integrated circuit is a MPU and the plural slave integrated circuits are one and the same DRAM.

Figure 32:
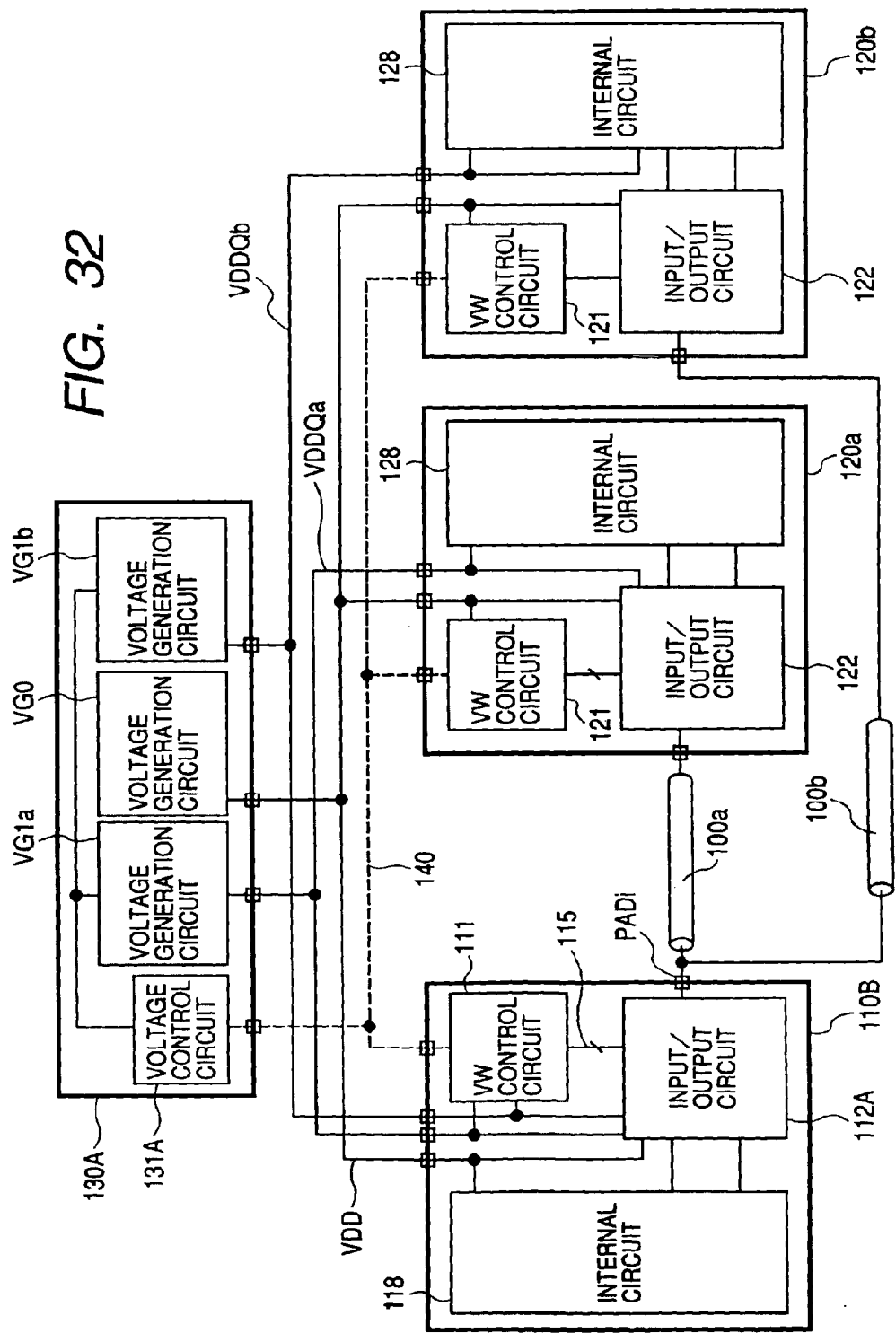
FIG. 32 is a block diagram illustrating a data processing system that uses interfacing supply voltages separately for each communication lines, in case of including plural slave integrated circuits.

FIG. 32 illustrates a data processing system that uses interfacing supply voltages VDDQa, VDDQb separately for each communication lines, in case the system includes plural slave integrated circuits. The dummy transmission line and the dummy output terminal in the individual integrated circuits are omitted in FIG. 32. Instead of supplying the same supply voltage to all of the master integrated circuit 110B, the slave integrated circuit 120a, and the slave integrated circuit 120b, the supply voltage can be optimized to each of the communication lines. In case of FIG. 32, a supply voltage generation circuit 130A generates three kinds of voltages VDD, VDDQa, and VDDQb. A supply voltage generation circuit VG1a is a circuit that generates the voltage VDDQa for the input/output circuits during communications between the master integrated circuit 110B and the slave integrated circuit 120a. A supply voltage generation circuit VG1b is a circuit that generates the voltage VDDQb, which is used during data transmissions between the master integrated circuit 110B and the slave integrated circuit 120b.

Figure 33:
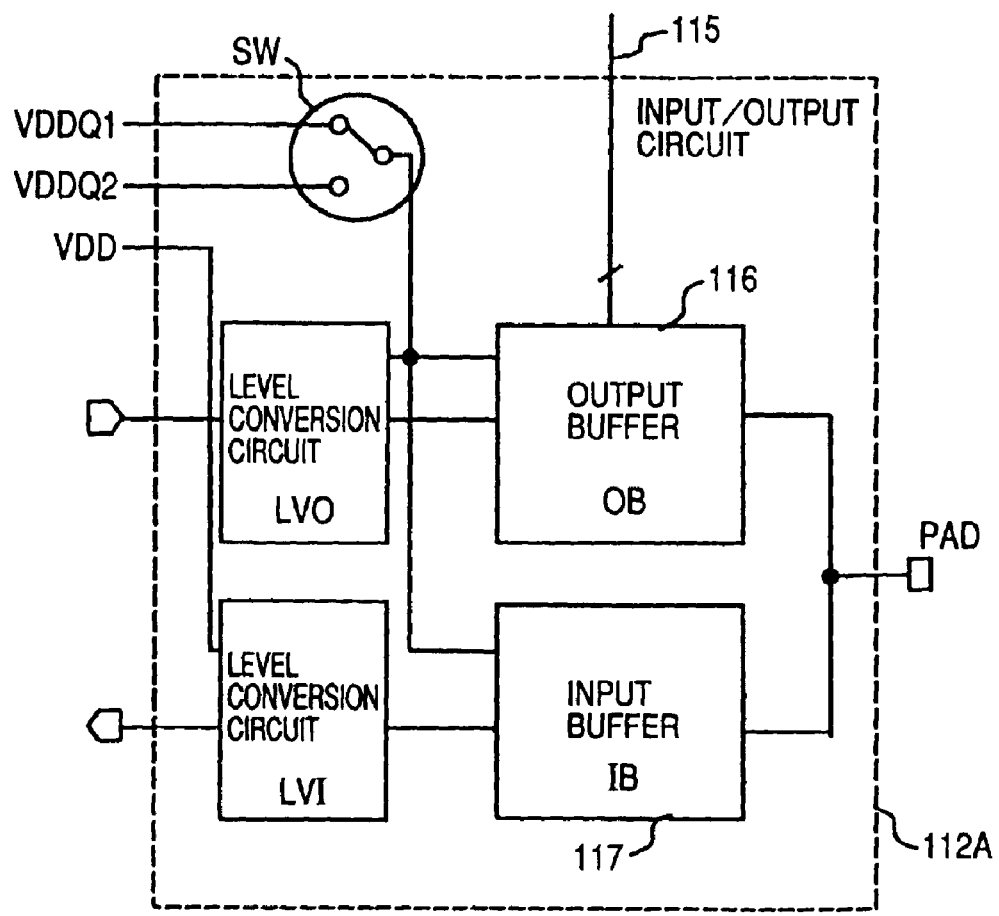
FIG. 33 is a block diagram illustrating an optimum input/output circuit for the data processing system in FIG. 32.

FIG. 33 illustrates an optimum input/output circuit 112A for the data processing system in FIG. 32. In the construction shown in FIG. 33, a communication partner is able to switch the supply voltage for the output buffer 116 by means of a switch SW. It is possible to provide tow output buffers 116 and use one of the two exclusively selectively, according to the communication partner. But, this example has an increased output capacitance, and attentions must be paid if this is used for a high-speed data transmission.

Figure 34:
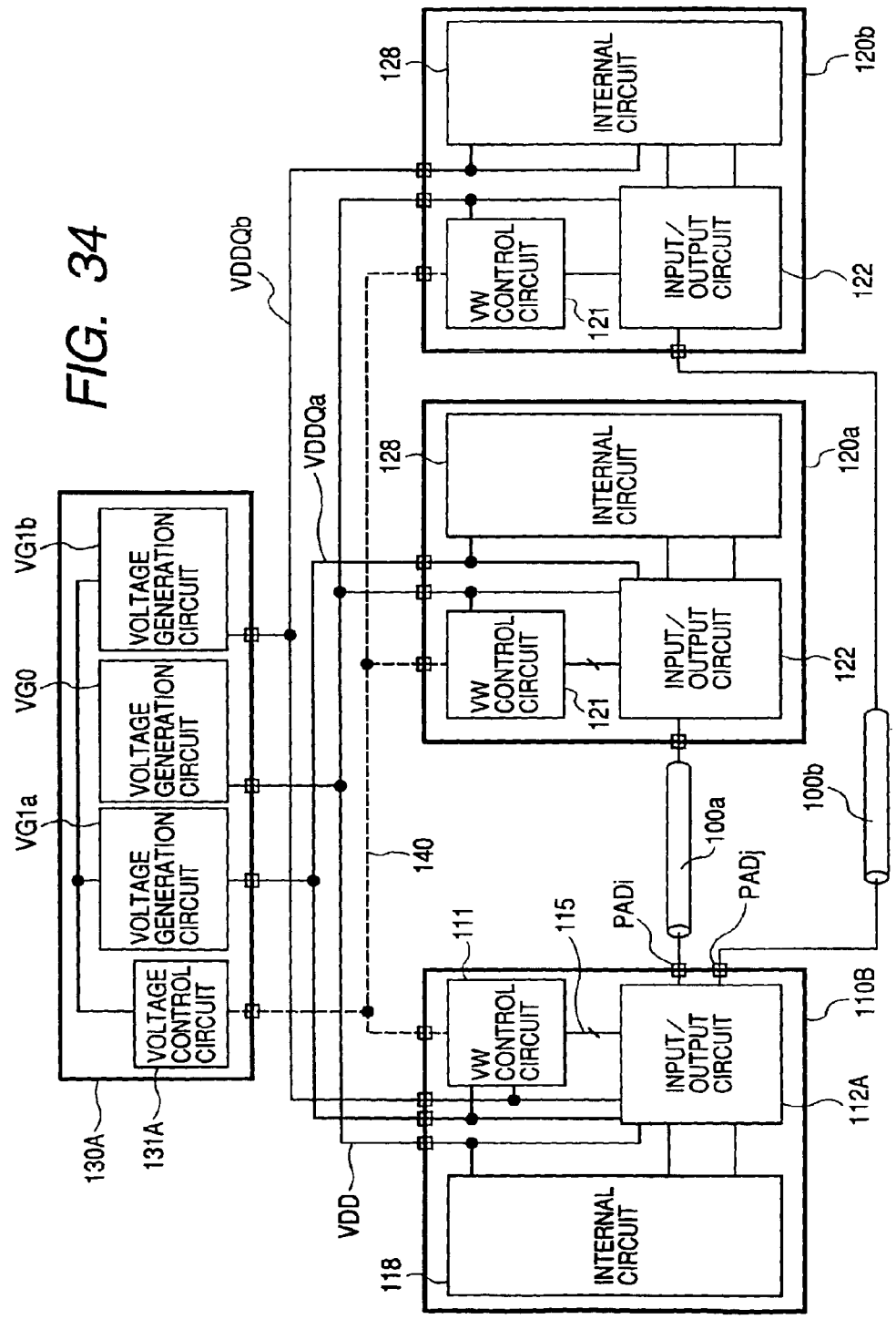
FIG. 34 is a block diagram illustrating an example, in which the plural slave integrated circuits are connected to separate external terminals of the input/output circuit.

FIG. 34 illustrates an example, in which the plural slave integrated circuits 120a, 12b are connected to separate external terminals PADi, PADj of the input/output circuit 112A. Also in this drawing, the dummy transmission line and the dummy output terminal are omitted. In this manner, the separate external terminals PADi, PADj are allocated each to the slave integrated circuits 120a, 120b having different signal amplitudes for interfacing. Thus, the interface switching between the master integrated circuit 110B and the slave integrated circuit 120a or the slave integrated circuit 120b can be made faster and smoother than the system in FIG. 32.

Figure 35:
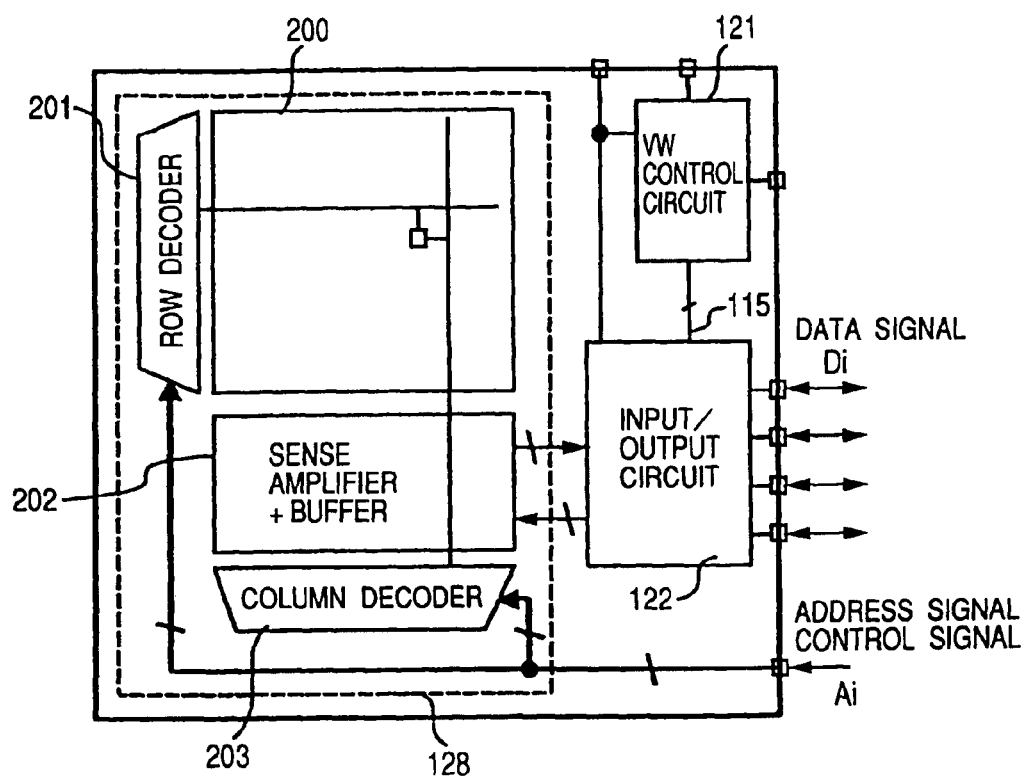
FIG. 35 is a block diagram illustrating a memory integrated circuit as an example of the slave integrated circuit.

FIG. 35 illustrates a memory integrated circuit as an example of the slave integrated circuit. An internal circuit 128 includes a memory cell array 200, in which memory cells having word lines connected to selection terminals and having bit lines connected to data input/output terminals are arrayed in a matrix, a row decoder 201 that decodes address signals and selects word lines, a sense amplifier and buffer 202 that amplifies a readout signal from the memory cell connected to the selected word line, and a column decoder 203 that selects the data amplified by the sense amplifier according to the address signal, and so forth. In regard to the readout operation of the memory, the data output of the sense amplifier 202 is connected to the input/output circuit 122. In regard to the write operation of the memory, the data is inputted from the input/output circuit 122 to the sense amplifier 202. In the drawing, the power supply for the memory internal circuits is omitted.

[IP Module]

In view of facilitating the designing of the master integrated circuit 110, it is conceivable to provide the design data of the VW control circuit 111 and the input/output circuit 112 (122), or the design data of the master integrated circuit 110 of its own, as the so-called IP (Intellectual Property) module. It is the same with the slave integrated circuit 120. The IP module is roughly divided into the hardware IP module that holds the mask pattern data and the drawing data of the circuits as well as the function description data based on the HDL (Hardware Description Language) and the RTL (Register Transfer Language) and so forth, and the software IP module that holds the function description data as the main part. The circuit module data as this IP module are to be used for designing an integrated circuit to be formed on a semiconductor chip with a computer. The circuit module data are stored in a recording medium to be readable for the computer.

The circuit module data provided as the IP module are the data to specify the VW control circuit shown in FIG. 10 and FIG. 16, which includes the diagram pattern data for forming these circuits into the semiconductor chip, or the function description data by the HDL and the RTL. The diagram pattern data include the mask pattern data and electron beam lithographic data, and so forth. The function description data are the so-called program data, and by reading the data into a specified design tool, the circuits and so forth can be specified with symbolic displays.

The scale of the IP module may be comparable to that of the semiconductor integrated circuit illustrated in FIG. 1

Figure 36:
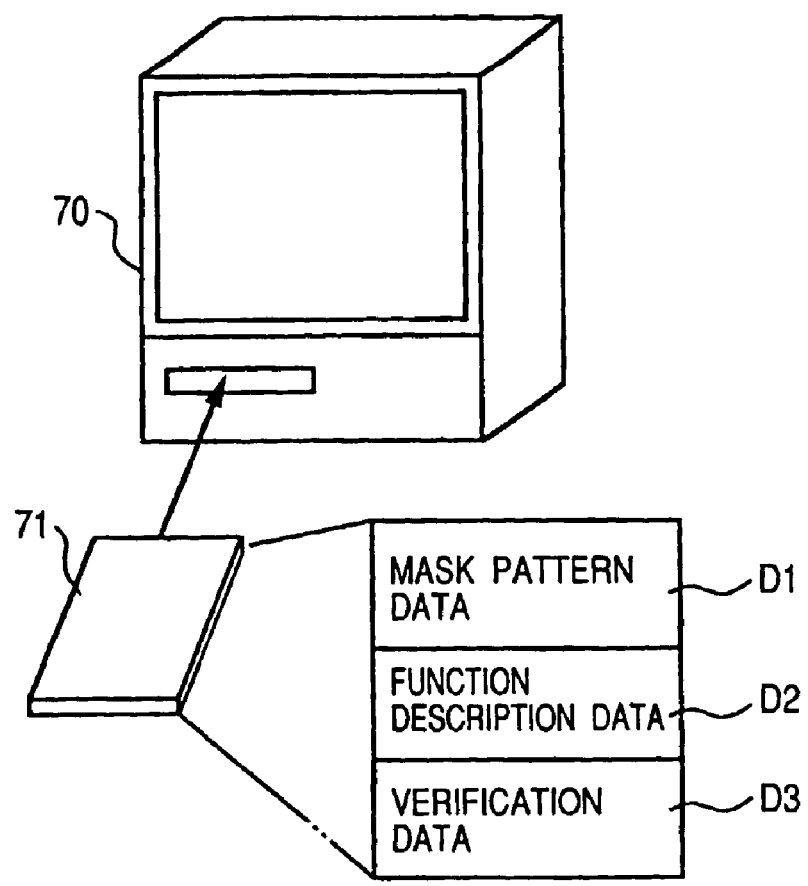
FIG. 36 is a chart illustrating a computer and a recording medium that stores the IP module readably by the computer.

As illustrated in FIG. 36, the data of the IP module are the data for designing an integrated circuit to be formed on a semiconductor chip with a computer 70 as the design tool. The data are stored in a recording medium 71 such as a CD-ROM, DVD-ROM, magnetic tape, etc., so that the computer can read the data. For example, the data of the hardware IP module corresponding to the VW control circuit 111 in FIG. 10 include mask pattern data D1 for forming the VW control circuit 111, function description data D2 for the VW control circuit 111, and verification data D3 that enable a simulation in consideration of relations with the other modules, in designing an LSI by using the IP module data of the VW control circuit 111.

The present invention has been described concretely on the basis of the embodiments, however the invention is not limited to that, and various changes and modifications are possible without a departure from the scope and spirit of the invention.

For example, the semiconductor integrated circuit is not limited to a MPU, DRAM, and the like, and it can be widely applied to various types of semiconductor integrated circuits. And, the number of the slave integrated circuits that share the transmission line with the master integrated circuit may be three or more.

INDUSTRIAL APPLICABILITY

The present invention can widely be applied to a semiconductor integrated circuit such as a microcomputer, a memory, etc., a data processing system that requires a ultra-low power consumption characteristic, such as a mobile telephone and a mobile information terminal, and further a data processing system that requires a high-speed data transmission, such as a network control device, and so forth.

What is claimed is:

1. A data processing system comprising: a first semiconductor integrated circuit; a second semiconductor integrated circuit; a transmission line that connects a first external output buffer of the first semiconductor integrated circuit to the second semiconductor integrated circuit, and connects a second external output buffer of the second semiconductor integrated circuit to the first semiconductor integrated circuit; and an external power supply circuit that generates an operational supply voltage to the first and the second external output buffers, wherein the first semiconductor integrated circuit instructs the external power supply circuit to be able to modify a level of the operational supply voltage, and includes a first operation mode capable of selectively controlling an output transistor size of the first external output buffer according to the operational supply voltage supplied according to the instruction, and wherein the second semiconductor integrated circuit includes a second operation mode capable of selectively controlling the output transistor size of the second external output buffer according to the operational supply voltage supplied from the external power supply circuit.

2. A data processing system according to claim 1, wherein the first semiconductor integrated circuit executes, in the first operation mode, a designation of the operational supply voltage from a lower level, and execute a selection of the output transistor size from a larger size.

3. A data processing system according to claim 1, wherein the first and the second semiconductor integrated circuits are individually capable of detecting error rates of data transmitted thereto, wherein in the first operation mode, the first semiconductor integrated circuit is capable of a selection-modification control of the output transistor size while increasing the operational supply voltage, until the sum of the error rates detected individually by the first and the second semiconductor integrated circuits becomes lower than a specified value, and wherein in the second operation mode, the second semiconductor integrated circuit is capable of responding to the selection-modification control by the first semiconductor integrated circuit, and capable of the selection-modification control of the output transistor size to the operational supply voltage modified by the instruction of the first semiconductor integrated circuit.

4. A data processing system according to claim 1, wherein the first semiconductor integrated circuit is specified as being in the first operation mode, starting with responding to a system reset until reaching an impedance matching between the transmission line and the first external output buffer, in which, in response to an arrival of a specific interval, an impedance mismatching between the transmission line and the first external output buffer is compensated by a specific amount to the matching direction, and wherein the second semiconductor integrated circuit is specified as being in the second operation mode, starting with responding to the system reset until reaching an impedance matching between the transmission line and the second external output buffer, in which, in response to the arrival of the specific interval, an impedance mismatching between the transmission line and the second external output buffer is compensated by the specific amount to the matching direction.

5. A data processing system according to claim 4, wherein the first semiconductor integrated circuit detects the arrival of the specific interval.

6. A data processing system according to claim 1, comprising a plurality of the second semiconductor integrated circuits, wherein the plural second semiconductor integrated circuits are connected to the first semiconductor integrated circuit by individual transmission lines, and the operational supply voltage is individualized to each of the transmission lines.

7. A data processing system comprising: a first semiconductor integrated circuit; a second semiconductor integrated circuit; and a transmission line that connects a first external output buffer of the first semiconductor integrated circuit to the second semiconductor integrated circuit, and connects a second external output buffer of the second semiconductor integrated circuit to the first semiconductor integrated circuit, wherein the first semiconductor integrated circuit includes an internal power supply circuit that generates an operational supply voltage to the first and the second external output buffers, instructs the internal power supply circuit to be able to modify a level of the operational supply voltage, and includes a first operation mode capable of selectively controlling an output transistor size of the first external output buffer according to the operational supply voltage generated according to the instruction, and wherein the second semiconductor integrated circuit includes a second operation mode capable of selectively controlling the output transistor size of the second external output buffer according to the operational supply voltage supplied from the internal power supply circuit of the first semiconductor integrated circuit.

8. A data processing system according to claim 7 wherein in the first operation mode, the first semiconductor integrated circuit selectively controls the output transistor size according to the operational supply voltage, in a direction of making an impedance matching of the transmission line and the first external output buffer, and wherein in the second operation mode, the second semiconductor integrated circuit selectively controls the output transistor size according to the operational supply voltage, in a direction of making the impedance matching of the transmission line and the first external output buffer.

9. A data processing system according to claim 8, wherein in the first operation mode, when it is impossible to select the output transistor size for making the impedance matching, the first semiconductor integrated circuit modifies to designate a level of the operational supply voltage, and redoes the selective control of the output transistor size, and wherein in the second operation mode, when it is impossible to select the output transistor size for making the impedance matching, the second semiconductor integrated circuit instructs the first semiconductor integrated circuit to modify the level of the operational supply voltage, and redoes the selective control of the output transistor size according to a modified operational supply voltage.

10. A data processing system according to claim 8, wherein in the first mode, the first semiconductor integrated circuit outputs first information to designate a level of the operational supply voltage, selectively controls the output transistor size according to the operational supply voltage answered in response to the first information, requests to modify the operational supply voltage by means of the first information to redo selecting the output transistor size when it is impossible to select the output transistor size for making the impedance matching, outputs second information to the outside, waits for third information answered from the second semiconductor integrated circuit to the second information, requests to modify the operational supply voltage by means of the first information to redo selecting the output transistor size, waits for fourth information answered from the second semiconductor integrated circuit to the second information, and completes the selective control of the output transistor size, wherein in the second mode, the second semiconductor integrated circuit inputs the second information from the first semiconductor integrated circuit, starts the selective control of the output transistor size according to the operational supply voltage by responding to the second information, outputs the third information to the first semiconductor integrated circuit when it is impossible to select the output transistor size for making the impedance matching, and outputs the fourth information to the first semiconductor integrated circuit when it is possible to select the output transistor size for making the impedance matching.

11. A data processing system according to claim 7 wherein the first semiconductor integrated circuit executes, in the first operation mode, a designation of the operational supply voltage from a lower level, and execute a selection of the output transistor size from a larger size.

12. A data processing system according to claim 7, wherein the first and the second semiconductor integrated circuits are individually capable of detecting error rates of data transmitted thereto, wherein in the first operation mode, the first semiconductor integrated circuit is capable of a selection-modification control of the output transistor size while increasing the operational supply voltage, until the sum of the error rates detected individually by the first and the second semiconductor integrated circuits becomes lower than a specified value, and wherein in the second operation mode, the second semiconductor integrated circuit is capable of responding to the selection-modification control by the first semiconductor integrated circuit, and capable of the selection-modification control of the output transistor size to the operational supply voltage modified by the instruction of the first semiconductor integrated circuit.

13. A data processing system according to claim 7, wherein the first semiconductor integrated circuit is specified as being in the first operation mode, starting with responding to a system reset until reaching an impedance matching between the transmission line and the first external output buffer, in which, in response to an arrival of a specific interval, an impedance mismatching between the transmission line and the first external output buffer is compensated by a specific amount to the matching direction, and wherein the second semiconductor integrated circuit is specified as being in the second operation mode, starting with responding to the system reset until reaching an impedance matching between the transmission line and the second external output buffer, in which, in response to the arrival of the specific interval, an impedance mismatching between the transmission line and the second external output buffer is compensated by the specific amount to the matching direction.

14. A data processing system according to claim 13, wherein the first semiconductor integrated circuit detects the arrival of the specific interval.

15. A data processing system according to claim 7, comprising a plurality of the second semiconductor integrated circuits, wherein the plural second semiconductor integrated circuits are connected to the first semiconductor integrated circuit by individual transmission lines, and the operational supply voltage is individualized to each of the transmission lines.

* * * * *